(12) United States Patent
Kawano et al.

(10) Patent No.: US 8,633,038 B2
(45) Date of Patent: Jan. 21, 2014

(54) MANUFACTURING METHOD OF SEMICONDUCTOR INTEGRATED CIRCUIT DEVICE

(75) Inventors: Hideo Kawano, Kanagawa (JP); Haruko Tamegai, Kanagawa (JP); Tooru Yashima, Yamagata (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/552,068

(22) Filed: Jul. 18, 2012

(65) Prior Publication Data

US 2013/0071958 A1 Mar. 21, 2013

(30) Foreign Application Priority Data

Sep. 20, 2011 (JP) ................. 2011-204244

(51) Int. Cl.
*H01L 21/66* (2006.01)
(52) U.S. Cl.
USPC ............... 438/17; 438/14; 324/761; 324/754
(58) Field of Classification Search
USPC ............... 438/14, 17; 324/754, 761
See application file for complete search history.

(56) References Cited

U.S. PATENT DOCUMENTS

| | | | |
|---|---|---|---|
| 3,716,356 A * | 2/1973 | Burnett .................. | 420/508 |
| 4,027,935 A * | 6/1977 | Byrnes et al. .......... | 439/289 |
| 5,000,779 A * | 3/1991 | German et al. ........ | 75/244 |
| 6,127,831 A * | 10/2000 | Khoury et al. ........ | 324/750.02 |
| 6,589,371 B1 * | 7/2003 | Kaibyshev et al. ... | 148/504 |
| 2002/0060160 A1 * | 5/2002 | Hu ......................... | 205/184 |
| 2002/0153913 A1 * | 10/2002 | Okubo et al. ......... | 324/761 |
| 2003/0027496 A1 * | 2/2003 | Back et al. ........... | 451/36 |
| 2003/0223283 A1 * | 12/2003 | Kunikiyo .............. | 365/200 |
| 2006/0261827 A1 * | 11/2006 | Cooper et al. ........ | 324/754 |
| 2010/0244869 A1 * | 9/2010 | Uchida et al. ........ | 324/754 |
| 2011/0147950 A1 * | 6/2011 | Tai et al. .............. | 257/778 |
| 2013/0000117 A1 * | 1/2013 | Baskaran et al. ..... | 29/874 |

FOREIGN PATENT DOCUMENTS

| | | |
|---|---|---|
| JP | 7-140168 | 6/1995 |
| JP | 8-115955 | 5/1996 |
| JP | 2002-162415 | 6/2002 |
| JP | 2004-093355 | 3/2004 |

* cited by examiner

*Primary Examiner* — Zandra Smith
*Assistant Examiner* — Sophia Nguyen
(74) *Attorney, Agent, or Firm* — Young & Thompson

(57) ABSTRACT

In wafer probe inspection for a flip-chip semiconductor device having a solder bump, electric test may be performed at a high temperature by causing a probe needle to directly contact a solder bump over a wafer. The inventors have examined such high temperature probe tests in various ways and revealed the following problems. When a high temperature probe test is performed at 90° C. or higher using a palladium alloy probe needle, tin diffusion due to a solder bump occurs at the needle point to raise resistance, resulting in causing open failure. According to the invention of the present application, at least the tip of a palladium-based probe needle has mainly a granular grain structure in a high temperature probe test performed with the palladium-based probe needle contacting a solder bump electrode over a semiconductor wafer.

12 Claims, 26 Drawing Sheets

FIG. 24

COMPARISON BETWEEN INSPECTION RESULTS USING COLUMNAR AND GRANULAR PROBE NEEDLES

| PROBE NEEDLE CRYSTAL STRUCTURE | TESTING TIME | TEMPERATURE (°C) | | | | | | |
|---|---|---|---|---|---|---|---|---|
| | | 25 | 90 | 100 | 110 | 120 | 130 |
| GRANULAR CRYSTAL | 10 SECONDS | ○ | ○ | ○ | ○ | ○ | ○ |
| | 60 SECONDS | ○ | ○ | ○ | ○ | ○ | ○ |
| COLUMNAR CRYSTAL | 10 SECONDS | ○ | ○ | ○ | × | × | × |
| | 60 SECONDS | ○ | × | × | × | × | × |

TEM IMAGE OF PROBE NEEDLE
WITH GRANULAR GRAIN STRUCTURE

SEM IMAGE OF PROBE NEEDLE WITH COLUMNAR GRAIN STRUCTURE (BOTTOM SURFACE OF NEEDLE)

MANUFACTURING METHOD OF SEMICONDUCTOR INTEGRATED CIRCUIT DEVICE

CROSS-REFERENCE TO RELATED APPLICATION

The disclosure of Japanese Patent Application No. 2011-204244 filed on Sep. 20, 2011 including the specification, drawings and abstract is incorporated herein by reference in its entirety.

BACKGROUND

The present invention relates to a technique which can be effectively applied to an electric test technique in a manufacturing method of a semiconductor integrated circuit device (or, semiconductor device).

Japanese Patent Laid-Open No. 7-140168 (Patent Document 1) discloses, in relation to a probe needle having tungsten as the base material for an electric test of a semiconductor device, a technique of doping tungsten with different types of metal such as gold, silver, copper or rhenium in order to prevent adhesion of foreign substance such as alumina from an aluminum pad when inspecting a wafer probe.

Japanese Patent Laid-Open No. 2002-162415 (Patent Document 2) or US Patent application publication No. 2002-153913 (Patent Document 3) corresponding to Patent Document 2 discloses high temperature wafer probe inspection (85° C. or 150° C.) using a palladium-based vertical needle. For the inspection, nickel or nickel alloy is plated over the surface of a palladium-based probe needle in order to keep sufficient pressure against an aluminum-based electrode over a wafer. The base material of the palladium-based probe needle is a palladium-based six-element alloy the composition of which is Pd: 35% by mass, Ag: 30% by mass, Pt: 10% by mass, Au: 10% by mass, Cu: 14% by mass, and Zn: 1% by mass.

Japanese Patent Laid-Open No. 2004-93355 (Patent Document 4) discloses, for wafer probe inspection using a palladium-based probe pin, a technique of doping gold, silver, platinum or the like and rendering the needle point into a non-flat shape in order to prevent solder transfer from the object to be inspected.

Japanese Patent Laid-Open No. 8-115955 (Patent Document 5) discloses, for probe inspection of a device or the like, a technique of coating, over a tin-plated electrode to be inspected, C, Eu, Ir or the like, which does not generate a compound with tin at the tip of a tungsten alloy needle having superior high temperature strength, and also suggests application to palladium alloy needles or the like.

SUMMARY

In wafer probe inspection for a flip-chip semiconductor device having a solder bump, electric test may be performed at a high temperature (about 90 to 130° C.) by causing a probe needle to directly contact a solder bump over a wafer. The inventors have examined such high temperature probe tests in various ways and revealed the following problems. When a high temperature probe test is performed at 90° C. or higher using a palladium alloy probe needle, tin diffusion due to a solder bump occurs at the needle point to raise resistance, resulting in open failure.

The present invention has been made in order to solve such problems.

The present invention has been made in view of the above circumstances and provides a highly reliable manufacturing process of semiconductor integrated circuit devices.

The other purposes and the new feature of the present invention will become clear from the description of the present specification and the accompanying drawings.

The following explains briefly the outline of a typical invention among the inventions disclosed in the present application.

According to one invention of the present application, at least the tip of a palladium-based probe needle has mainly a granular grain structure in a high temperature probe test performed with the palladium-based probe needle contacting a solder bump electrode over a semiconductor wafer.

The following explains briefly the effect acquired by the typical invention among the inventions disclosed in the present application.

Open failure or the like due to raised resistance at the needle point by diffusion of solder components can be prevented from occurring by providing at least the tip of a palladium-based probe needle with mainly a granular grain structure in a high temperature probe test performed with the palladium-based probe needle contacting a solder bump electrode over a semiconductor wafer.

BRIEF DESCRIPTION OF THE DRAWINGS

FIG. 24 is a table comparing the result of a high temperature wafer probe test using probe needles having columnar and granular structures;

DETAILED DESCRIPTION

Outline of Embodiments

Figure 1:
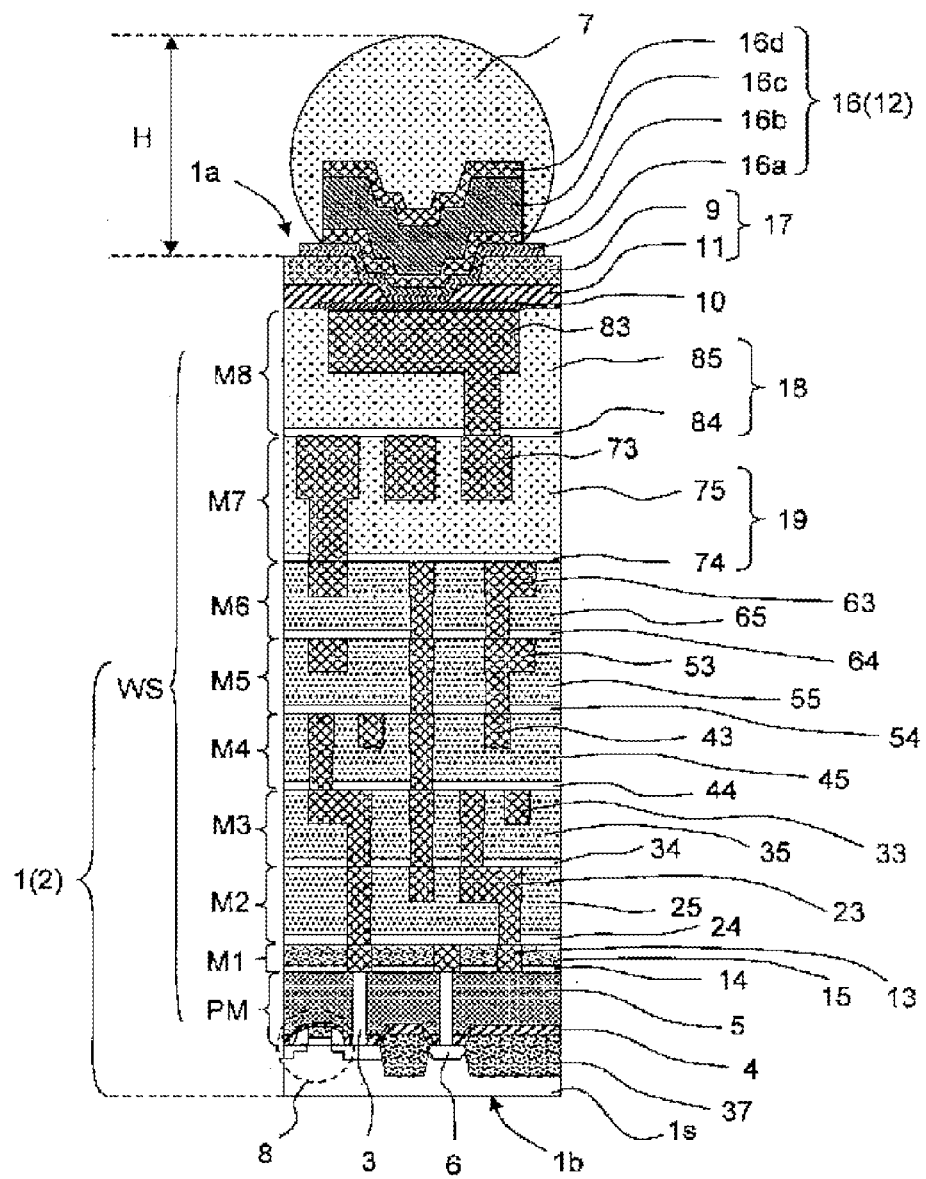
FIG. 1 is a schematic cross-sectional view of a semiconductor wafer when performing a wafer probe test, illustrating an exemplary target device structure in a manufacturing method of a semiconductor integrated circuit device according to an embodiment of the present application.

First, outline of representative embodiments of the invention disclosed in the present application will be described.

1. Manufacturing method of a semiconductor integrated circuit device including the following steps of: (a) forming a plurality of integrated circuit chip regions over a first major surface of a semiconductor wafer; (b) forming a plurality of solder bumps for each of the integrated circuit chip regions by wafer processing; (c) performing a high temperature probe test with a palladium-based probe needle contacting each of the solder bumps over an integrated circuit chip region to be inspected, among the integrated circuit chip regions, at least the tip of the palladium-based probe needle having mainly a granular grain structure.

2. In the manufacturing method of a semiconductor integrated circuit device of item 1, the solder bumps are tin-based lead-free solder.

3. In the manufacturing method of a semiconductor integrated circuit device of item 1 or 2, at least the tip and a vicinity of the tip of the palladium-based probe needle have mainly a granular grain structure.

4. In the manufacturing method of a semiconductor integrated circuit device of item 1 or 2, substantially a whole of the palladium-based probe needle has mainly a granular grain structure.

5. In the manufacturing method of a semiconductor integrated circuit device of any one of items 1 to 4, the tip and the vicinity of the tip of the palladium-based probe needle are substantially perpendicular to the first major surface of the semiconductor wafer.

6. In the manufacturing method of a semiconductor integrated circuit device of item 5, at least a part of the upper half of the palladium-based probe needle is curved.

7. In the manufacturing method of a semiconductor integrated circuit device of any one of items 1 to 6, the palladium-based probe needle contains silver as one of major components besides palladium.

8. In the manufacturing method of a semiconductor integrated circuit device of any one of items 1 to 6, the palladium-based probe needle contains silver and copper as one of major components besides palladium.

9. In the manufacturing method of a semiconductor integrated circuit device of any one of items 1 to 8, the high temperature probe test is performed with the semiconductor wafer being heated to a predetermined temperature of 90° C. or higher and 130° C. or lower.

10. In the manufacturing method of a semiconductor integrated circuit device of any one of items 1 to 9, each of the solder bumps is provided over a non-aluminum-based metal pad.

11. In the manufacturing method of a semiconductor integrated circuit device of item 10, the non-aluminum-based metal pad is not provided with a gold-based film.

12. In the manufacturing method of a semiconductor integrated circuit device of any one of items 1 to 11, the tip surface of the palladium-based probe needle has a substantially flat shape.

[Explanation of Notation, Basic Terms, and Usage in Present Application]

1. In the present application, embodiments will be explained, divided into plural sections or embodiments, if necessary for convenience. Except for the case where it shows clearly in particular, they are not mutually unrelated and one has relationships such as a modification, details, and supplementary explanation of some or entire of another. In addition, as a principle, repeated explanation of similar parts is omitted. Furthermore, each element in the embodiments is not necessarily indispensable, except for the case where it is clearly specified in particular and where it is considered to be clearly indispensable from a theoretical point of view.

Furthermore, the terms "semiconductor device" or "semiconductor integrated circuit device" mentioned in the present application mainly refer to units of various transistors (active elements) as well as surrounding resistors, capacitors or the like being integrated over a semiconductor chip (a single crystal silicon substrate or the like). A MISFET (Metal Insulator Semiconductor Field Effect Transistor) represented by a MOSFET (Metal Oxide Semiconductor Field Effect Transistor) can be given as a representative example of the various transistors. On this occasion, a CMIS (Complementary Metal Insulator Semiconductor) integrated circuit represented by a CMOS (Complementary Metal Oxide Semiconductor) integrated circuit, which is a combination of an N-channel MISFET and a P-channel MISFET, can be given as a representative example of the integrated circuit configuration.

A typical wafer process of today's semiconductor integrated circuit device, LSI (Large Scale Integration), can be roughly divided into a FEOL (Front End of Line) process ranging from carrying in of a silicon wafer as a material to a Premetal process (a process including formation of an interlayer insulating film between an M1 wiring layer lower end and the gate electrode structure, formation of a contact hole, and embedding of a tungsten plug), and a BEOL (Back END of Line) process ranging from formation of the M1 wiring layer to formation of a pad opening in a final passivation film over a pad electrode. The flip-chip product or wafer level packaging process also includes a UBM (Under Bump Metal) formation process, a bump formation process or the like.

2. Similarly, in the description of the embodiments, the expression "X including A" with regard to materials or compositions does not exclude an element other than A from being one of the main components unless explicitly stated otherwise or obviously being the contrary from the context. As for a component, it means "X including A as the main component". A "silicon member" is not limited to pure silicon but may include a member containing SiGe alloy or other multi-element alloy having silicon as the main component, and other additives. Similarly, "silicon oxide film", "silicon oxide insulating film" or the like includes not only relatively pure Undoped Silicon Dioxide but also thermal oxidization film such as FSG (Fluorosilicate Glass), TEOS-based silicon oxide, SiOC (Silicon Oxicarbide) or Carbon-doped Silicon oxide or OSG (Organosilicate glass), PSG (Phosphorus Silicate Glass), or BPSG (Borophosphosilicate Glass), coated silicon oxide such as a CVD oxidation film, SOG (Spin ON Glass), or Nano-Clustering Silica:NCS, silica-based Low-k insulating films (porous-based insulating films) having empty holes introduced into a member similar to those mentioned above, and composite films with other silicon-based insulating films having these as the main component.

In addition, a silicon nitride insulating film is the silicon-based insulating films regularly used in a semiconductor field, as well as a silicon oxide insulating film. Included in materials belonging to this series are: SiN, SiCN, SiNH, SiCNH or the like. "silicon nitride" includes both SiN and SiNH, unless explicitly stated otherwise. Similarly, "SiCN" includes both SiCN and SiCNH unless explicitly stated otherwise.

Although SiC has a property similar to SiN, SiON should be classified as a silicon oxide insulating film in many cases.

Silicon nitride films are frequently used as an etch stop film, a CESL (Contact Etch-Stop Layer) in the SAC (Self-Aligned Contact) technique, and also used as stress applying films in the SMT (Stress Memorization Technique).

3. Similarly, although a preferred illustration is provided with regard to figures, positions, attributes or the like, the invention is not strictly limited to the illustration unless explicitly stated otherwise or obviously being the contrary from the context.

4. Furthermore, even if a particular numerical value or quantity is mentioned, the numerical value may be exceeded or the numerical value may not be reached, unless explicitly stated otherwise, theoretically limited to the number, or obviously being the contrary from the context.

5. Although a "wafer" usually refers to a single crystal silicon wafer over which a semiconductor integrated circuit device (similarly, a semiconductor device or an electronic device) will be formed, a composite wafer of an insulation substrate, such as an epitaxial wafer, an SOI substrate or an LCD glass substrate, and a semiconductor layer, is also included.

6. In the present application, an "integrated circuit chip region" refers to a region supposed to be a semiconductor chip after wafer division.

In addition, a "high temperature probe test" refers to an electric test, among wafer probe tests, which is performed with the wafer temperature set to a predetermined temperature of 80° C. or higher. Although a general upper limit temperature is around 200° C., it is usually considered to be around 150° C. for products having a tin-based solder bump mainly described in the present application. There are also a "room temperature test" and a "low temperature test" with regard to the temperature of the wafer probe test, in which the "room temperature test" is usually performed at a wafer temperature of around 25° C. (generally in a range from 15° C. to 35° C.). On the other hand, the "low temperature test" is usually performed at a wafer temperature of around −40° C. (generally in a range from −10° C. to −60° C.).

7. In the present application, a "tip" of a probe needle refers to a range where diffusion of solder components from a "tip surface" is concerned. On the other hand, a "vicinity of the tip" refers to a part which can be the "tip" in the course of repeating cleaning of the needle point. In addition, an "upper half", which is a part including the upper end, refers to the "tip" and a part above the "vicinity of the tip".

Probe needles can be classified into "cantilever type probe needles" (including micro cantilevers) with the tip extending diagonally against the surface of the wafer, and "vertical tip probe needles" with the tip extending vertically against the surface of the wafer. Vertical tip probe needles can be further classified into "entirely-vertical probe needles" which are substantially linear shaped as a whole, and "vertical-tip curved probe needles" ("Cobra needles") a part of which is bent or curved. Although vertical-tip curved probe needles are mainly described in the following embodiments, the present invention can also be applied to entirely-vertical probe needles and cantilever type probe needles.

In addition, with regard to the needle base material, the base material of a probe needle mainly includes tungsten, palladium alloy, and copper beryllium alloy. Corresponding respectively to them, there are tungsten-based probe needles, palladium-based probe needles, and copper beryllium-based probe needles. Tungsten-based probe needles are comparatively rigid and suitable for contacting aluminum-based pads. Palladium-based probe needles are considered to be relatively soft and suitable for contacting gold bumps or solder bumps. On the other hand, copper beryllium-based probe needles are suitable for contacting large-current devices. Although palladium-based probe needles are mainly described in the following embodiments, the present invention can also be applied to tungsten-based probe needles and copper beryllium-based probe needles.

8. In a "flip-chip semiconductor element", a bump electrode is usually formed over the upper layer of a generally circular (circular, octagonal, hexagonal, or the like) metal pad (shifted horizontally when using rewiring), while an "aluminum-based metal pad" (aluminum-based metal pad method) or a "non-aluminum-based metal pad" (non-aluminum-based metal pad method) is mainly used as the metal pad. Although the "aluminum-based metal pad method" has a merit that wafers can be shared with wire bonding products, the process is accordingly complicated. On the other hand, the "non-aluminum-based metal pad method" has a merit that the structure can be simplified over copper-based embedded wirings, and structure becomes very simple by a method using UBM (Under Bump Metal) as the metal pad (referred to as "UBM pad method"). Although the UBM pad method is mainly described in the following embodiments, the present invention can also be applied to the aluminum-based metal pad method and the non-aluminum-based metal pad method other than the UBM pad method.

Flip-chip semiconductor elements include the WLP (Wafer Level Package) type, as well as the Bare Chip type mainly as described in the following, and the present invention can also be applied to the WLP-type.

9. "Solder" is a metal material with a low melting point (around lower than 250° C.) generally having tin as one of the major components. The "solder" includes "lead-containing solder" which contains lead and "lead-free solder" which does not. In the present application, lead-free solder having tin as a major component is particularly referred to as "tin-based lead-free solder".

In addition, tin-based lead-free solders include silver-doped tin-based lead-free solder, bismuth-doped tin-based lead-free solder, silver/copper-doped tin-based lead-free solder, silver/antimony/bismuth-doped tin-based lead-free solder, and bismuth/silver/copper-doped tin-based lead-free solder. Although the following embodiments are specifically described taking silver-doped tin-based lead-free solder (melting point: around 221° C.) having about 1.5% by weight of silver doped in the tin-based lead-free solder, another silver-doped tin-based lead-free solder (around 3.5% by weight of silver doped) and other two-element tin-based lead-free solder, three-element tin-based lead-free solder, or four-element tin-based lead-free solder will also do. In spite of the expression "lead-free", normally a very small amount of lead is contained.

Details of Embodiments

The embodiments will be explained in further detail. In the drawings, identical or similar parts are indicated by identical or similar symbols or reference numerals, in which repetitive explanation is omitted in principle.

In the accompanying drawings, hatching of a cross section may be omitted if it rather complicates the figure, or if distinction with a void is obvious. Similarly, the background profile line of a planarly closed hole may be omitted if it is obvious from the explanation. Furthermore, hatching may be provided to a position other than a cross section in order to explicitly indicate that it is not a void.

1. Explanation of an exemplary target device structure in the manufacturing method of a semiconductor integrated circuit device according to the embodiment of the present application (see mainly FIG. 1)

Although specific description is provided in this section taking, as an example of semiconductor integrated circuit chip, a CMIS integrated circuit having a large number of 40 nm technology node MISFETs integrated on it, not only MIS integrated circuits but also bipolar integrated circuits or individual devices will do in the following embodiments. In addition, the following examples are not limited to 40 nm technology node devices, and can also be applied to finer or less fine technology node devices. These semiconductor integrated circuit chips correspond to SOC (System on Chip) type chips, microcomputer and peripheral chips, as a circuit system.

Additionally, although a specific description is provided in this section taking an integrated circuit having eight-layer copper-based embedded wiring as an example, embodiments of the present application can also be applied to an integrated circuit having a wiring system with a different number of layers.

FIG. 1 is a schematic cross-sectional view of a semiconductor wafer when performing a wafer probe test, illustrating an exemplary target device structure in a manufacturing method of a semiconductor integrated circuit device according to an embodiment of the present application. Based on the figure, an exemplary target device structure in the manufacturing method of a semiconductor integrated circuit device according to the embodiment of the present application will be described.

As shown in FIG. 1, a P-channel MOSFET or an N-channel MOSFET (8) is formed over a device surface 1a (surface opposite to a back side 1b) of a P-type single crystal silicon substrate is (wafer 1 or semiconductor chip 2) isolated by an STI (Shallow Trench Isolation) type element isolation field insulating film 37. A silicon nitride liner film 4 (about 30 nm thick) which is an etch stop film is formed over the P-channel MOSFET or an N-channel MOSFET (8). A Premetal interlayer insulating film 5 which is much thicker than the silicon nitride liner film 4 and includes an underlying ozone TEOS oxidation silicon film (about 200 nm thick) formed by thermal CVD, and an overlying plasma TEOS silicon oxide film (about 270 nm thick) are formed over the silicon nitride liner film 4. In addition, a tungsten plug 3 is formed penetrating these pre-metal insulating films. The layer on which the silicon nitride liner film 4 and the pre-metal interlayer insulating film 5 exist is a pre-metal region PM.

A first wiring layer M1 lying over the pre-metal interlayer insulating film 5 includes an insulating barrier film 14 such as an underlying SiC film (about 50 nm thick), a plasma silicon oxide film 15 (about 150 nm thick) which is an inter-main-layer insulating film, and a copper wiring 13 embedded in a wiring groove formed in these films. The layer is a copper-based embedded wiring of the Single Damascene structure.

The second to sixth wiring layers M2, M3, M4, M5 and M6 lying over the first wiring layer M1 are copper-based embedded wirings of the Dual Damascene structure, having a structure substantially similar to each other. Each layer includes insulating barrier films (liner films) 24, 34, 44, 54 and 64 including an underlying SiC film (about 50 nm thick), and inter-main-layer insulating films 25, 35, 45, 55 and 65 which occupy most of the regions of the upper layer. The inter-main-layer insulating films 25, 35, 45, 55 and 65 include a carbon-doped silicon oxide film (an SiOC film (about 400 nm thick)). Copper embedded wirings 23, 33, 43, 53 and 63 including a copper plug and a copper wiring are formed penetrating the interlayer insulating film. The first to sixth wiring layers M1, M2, M3, M4, M5 and M6 are local wirings in this example.

The seventh to eighth wiring layers M7 and M8 lying over the second to sixth wiring layers M2, M3, M4, M5 and M6, having substantially a similar structure to each other, are copper-based embedded wirings of the Dual Damascene structure. A global underlying wiring layer interlayer insulating film 19 includes an insulating barrier film 74 such as an underlying SiC film (about 70 nm thick), an overlying plasma TEOS silicon oxide film 75 (about 850 nm thick), or the like. A copper embedded wiring 73 including a copper plug and a copper wiring is formed penetrating the interlayer insulating films. Although description is omitted, the side surface and the bottom surface of the copper embedded wiring 73 are surrounded by a barrier metal film such as a TaN film (including a film stacked with the Ta film) (the same goes with the copper embedded wirings described below).

On the other hand, a global overlying wiring layer interlayer insulating film 18 includes an insulating barrier film 84 such as an underlying SiC film (about 70 nm thick), an overlying plasma TEOS silicon oxide film 85 (about 1200 nm thick), or the like. A copper embedded wiring 83 including a copper plug and a copper wiring is formed penetrating the interlayer insulating films. An embedded barrier metal film over the eighth wiring layer (a TiN film about 200 nm thick) caps over the copper embedded wiring 83. Up to here is included in the embedded multi-layer wiring layer DW. Although the global wiring is assumed to have two layers, the number of layers of the global wiring can be three or more, or can be one, as necessary.

Lying over the global overlying wiring layer interlayer insulating film 18 is a final passivation film 17 including an underlying inorganic final passivation film 11 (an SiON film about 300 nm thick), an overlying organic final passivation film 9 (a polyimide film about 1.5 μm thick), or the like. Other silicon oxide insulating films, silicon nitride insulating films, and composite films of these films are preferred as inorganic final passivation films, without being limited to SiON films. In addition, heat-resistant polymer resin films such as BCB (Benzocyclobutene) insulating film are preferred as organic final passivation films besides polyimide insulating films.

These final passivation films 17 have a lower UBM film 16a (a TiW film about 200 nm thick) provided in its opening and over its top surface, over which a lower copper film 16b (about 200 nm thick) is provided. As the lower part UBM film, chrome, titanium, tungsten, or composite films of these films are preferred besides TiW films.

Over the lower copper film 16b, as a barrier film against the solder, a nickel film 16c (about 3 μm thick) is provided, over which an upper copper film 16d (about 400 nm thick) is provided as a coupling surface with the solder. An UBM film 16 is formed by the lower UBM film 16a, the lower copper film 16b, the nickel film 16c and the upper copper film 16d, and the whole of them also form a metal pad 12.

Furthermore, a solder bump 7 is formed over the metal pad 12. In this example, the bump height H is about 80 μm. For the solder bump 7, which is a lead-free solder, a tin-based lead-free solder (the composition of which being 98.5% by weight of tin, 1.5% by weight of silver, and the melting point being about 221° C.) can be given as a preferred example. The tin-based lead-free solder is not limited to two-element based solders such as Sn—Ag based or Sn—Bi based solders. Three-element based solders such as Sn—Ag—Cu based or four-element based solders such as Sn—Bi—Ag—Cu based or Sn—Ag—Bi—Sb based solders will do provided that they have melting points of 200° C. or higher.

As thus described above, this example is characterized in that the metal pad 12 is a non-aluminum-based metal pad, and the UBM film 16 does not include a gold film. An aluminum-based metal pad may be formed in place of the non-aluminum-based metal pad. In addition, the UBM film 16 may have a gold film provided in it. However, employing a non-aluminum-based metal pad brings about a merit that the device structure becomes very simple. In addition, not employing an expensive gold film brings about a cost advantage.

2. Explanation of a bump formation process in the manufacturing method of a semiconductor integrated circuit device according to the embodiment of the present application (see mainly FIGS. 2 to 9, and FIG. 1)

As solder bump formation methods, there are the SMD (Solder Mask Defined) type in which both sides of a bump are defined by edges of a polyimide final passivation film (organic final passivation film), and the non-SMD (non-Solder Mask Defined) type which does not define both sides of a bump by edges of a polyimide final passivation film. Although the non-SMD type is explained in this section, embodiments of the present application can also be applied to the SMD type.

Figure 2:
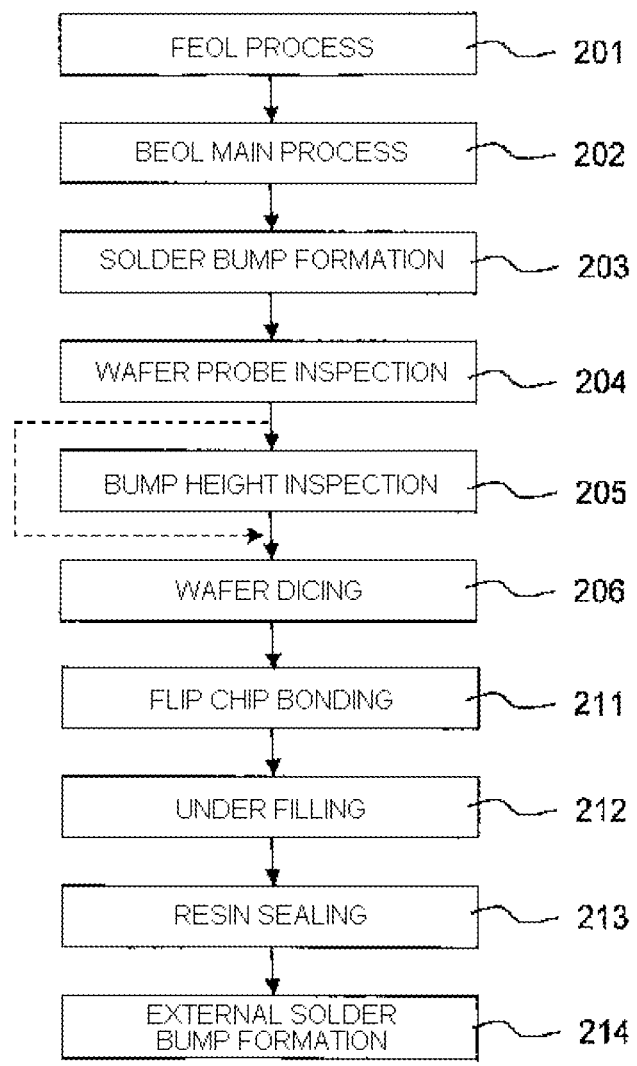
FIG. 2 is a process block flow diagram for explaining the outline of a manufacturing process in the manufacturing method of a semiconductor integrated circuit device according to the embodiment of the present application.
Figure 3:
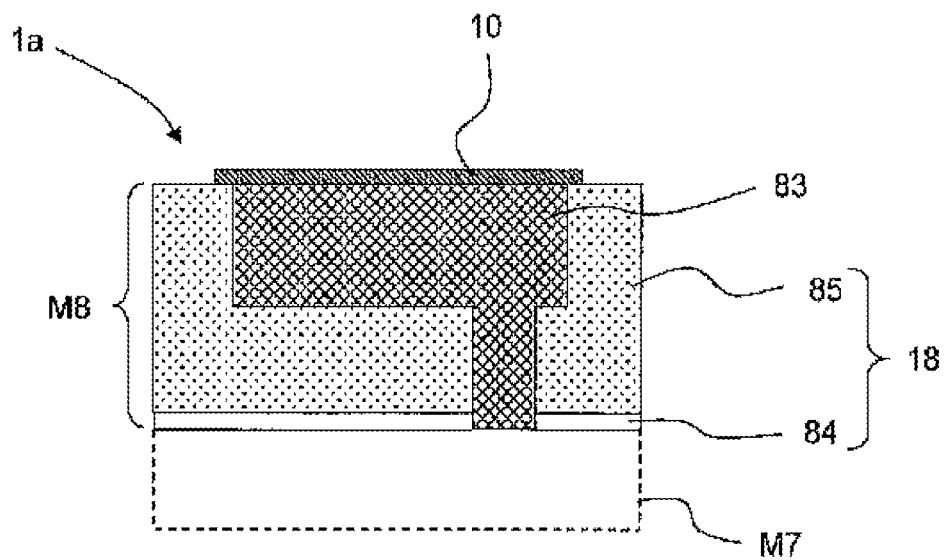
FIG. 3 is a partial schematic cross-sectional view of a semiconductor wafer for explaining a bump formation process in the manufacturing method of a semiconductor integrated circuit device according to the embodiment of the present application (at completion of formation of a wiring layer WS over a semiconductor substrate)
Figure 4:
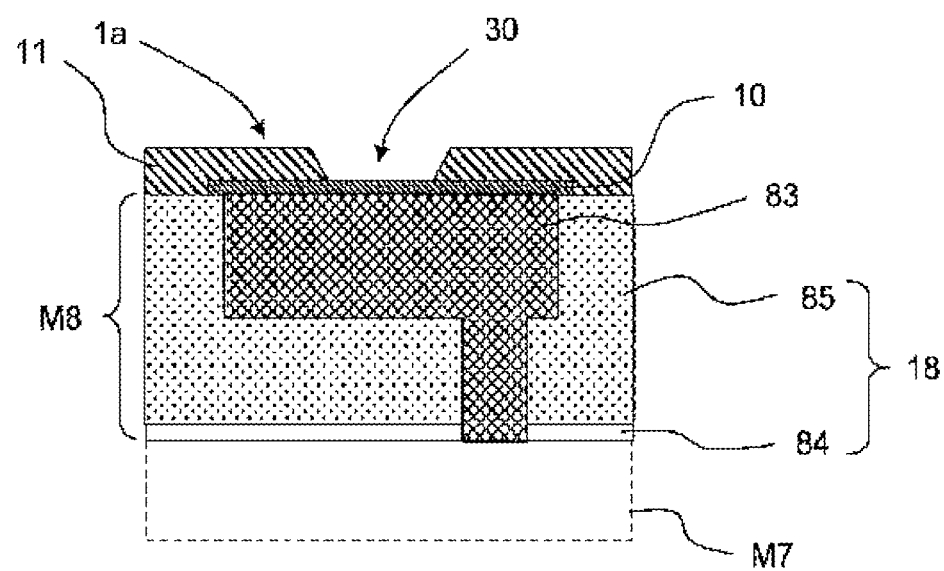
FIG. 4 is a partial schematic cross-sectional view of a semiconductor wafer for explaining a bump formation process in the manufacturing method of a semiconductor integrated circuit device according to the embodiment of the present application (at completion of formation of an opening of an inorganic final passivation film)
Figure 5:
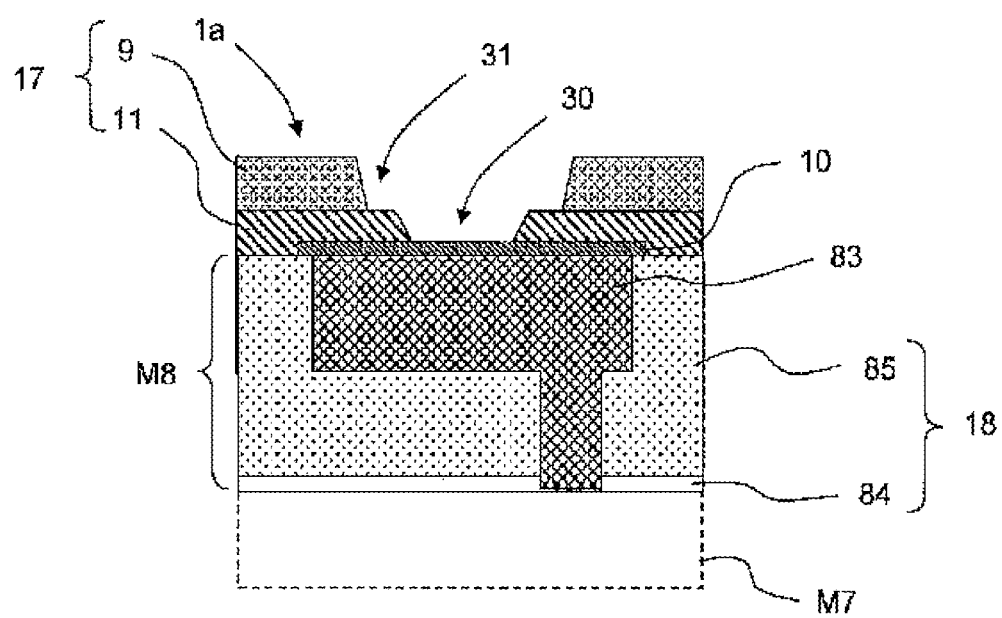
FIG. 5 is a partial schematic cross-sectional view of a semiconductor wafer for explaining a bump formation process in the manufacturing method of a semiconductor integrated circuit device according to the embodiment of the present application (at completion of formation of an opening of an organic final passivation film)
Figure 6:
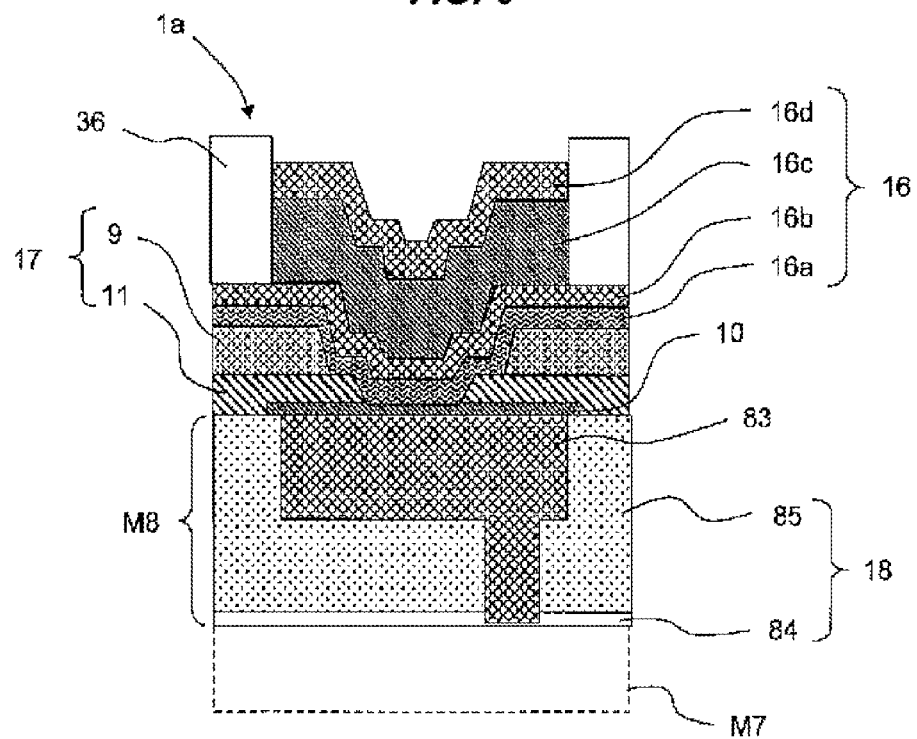
FIG. 6 is a partial schematic cross-sectional view of a semiconductor wafer for explaining a bump formation process in the manufacturing method of a semiconductor integrated circuit device according to the embodiment of the present application (at completion of formation of a UBM film)
Figure 7:
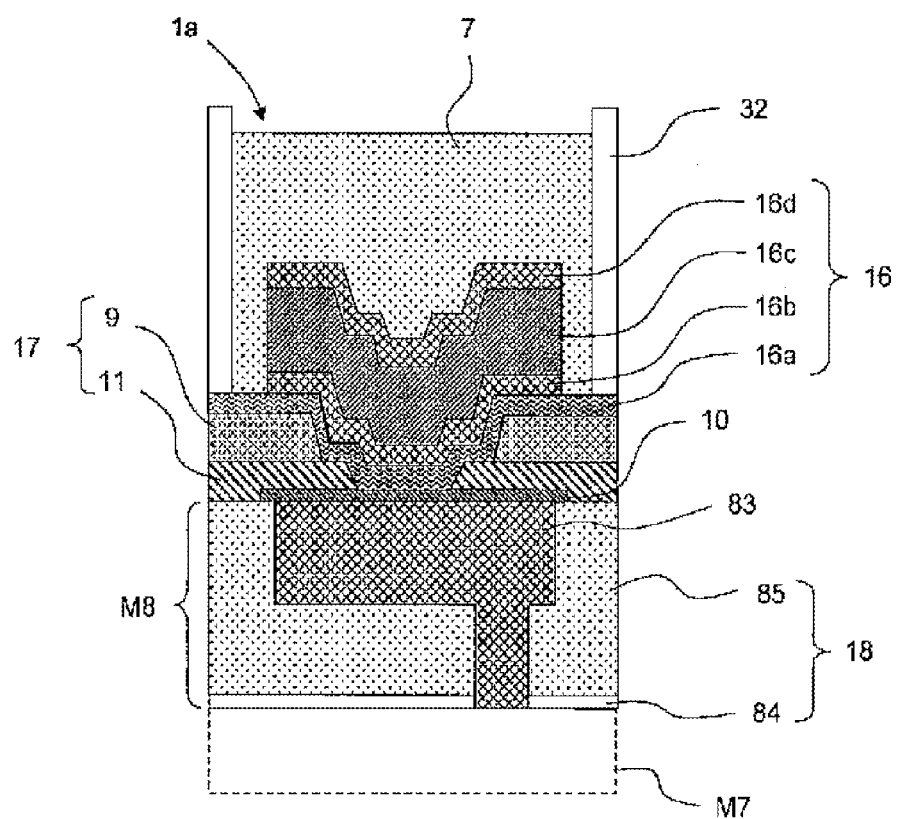
FIG. 7 is a partial schematic cross-sectional view of a semiconductor wafer for explaining a bump formation process in the manufacturing method of a semiconductor integrated circuit device according to the embodiment of the present application (at completion of solder plating)
Figure 8:
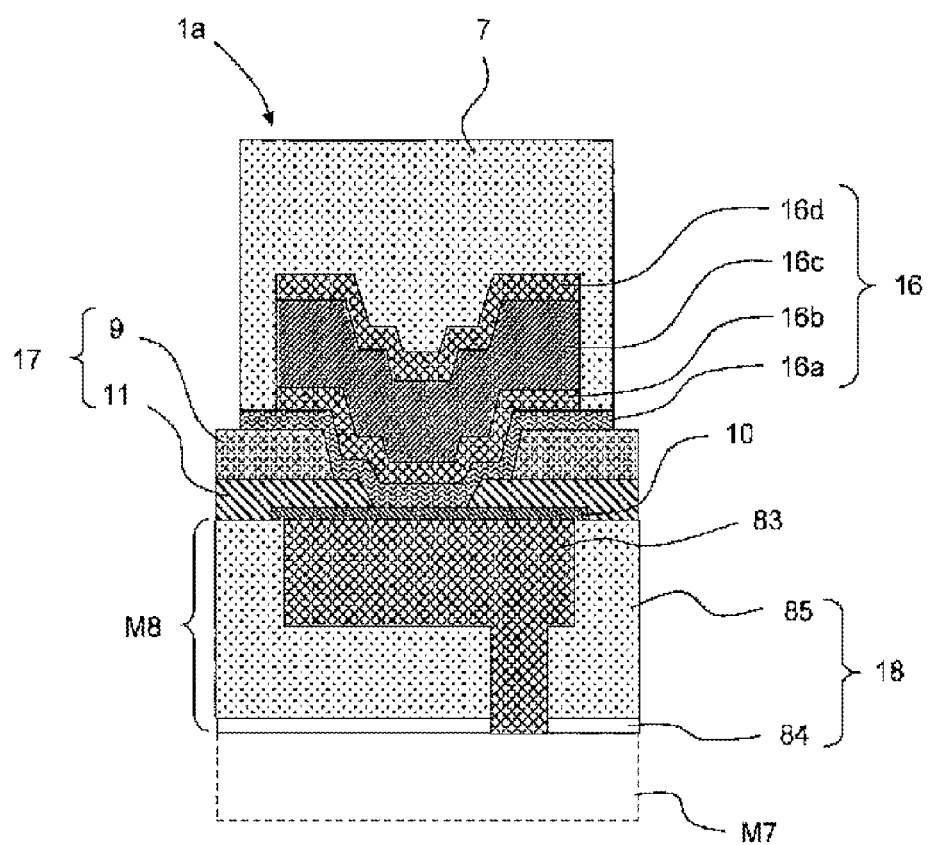
FIG. 8 is a partial schematic cross-sectional view of a semiconductor wafer for explaining a bump formation process in the manufacturing method of a semiconductor integrated circuit device according to the embodiment of the present application (at completion of fabrication of the bottom layer film of the UBM film)
Figure 9:
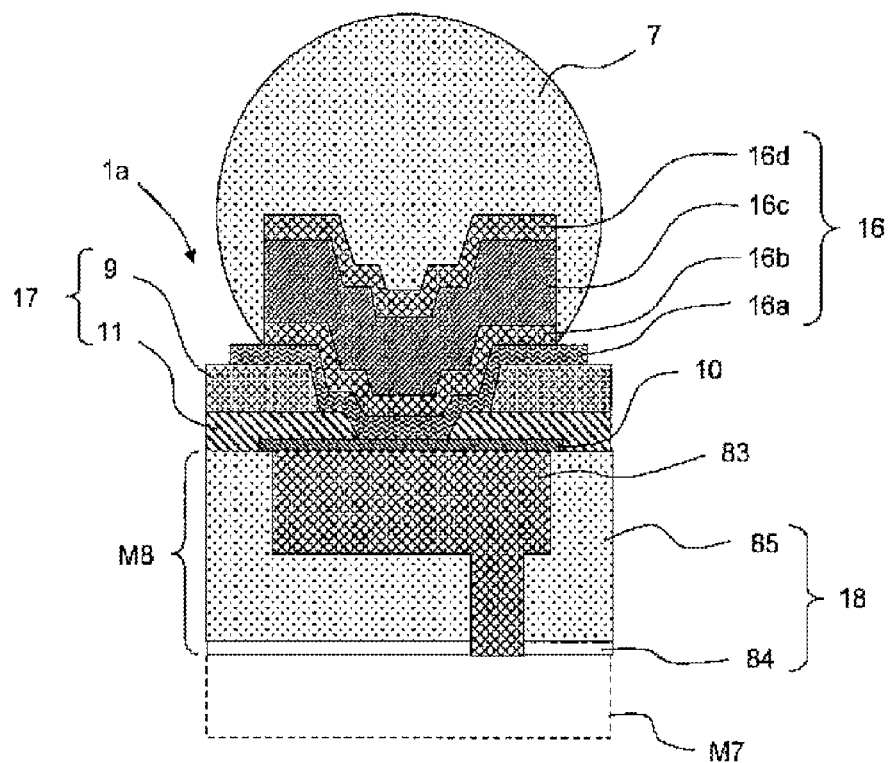
FIG. 9 is a partial schematic cross-sectional view of a semiconductor wafer for explaining a bump formation process in the manufacturing method of a semiconductor integrated circuit device according to the embodiment of the present application (at completion of reflow)

FIG. 2 is a process block flow diagram explaining the outline of the manufacturing process in the manufacturing method of a semiconductor integrated circuit device according to the embodiment of the present application. FIG. 3 is a partial schematic cross-sectional view of a semiconductor wafer for explaining a bump formation process in the manufacturing method of a semiconductor integrated circuit device according to the embodiment of the present application (at completion of formation of a wiring layer WS over a semiconductor substrate). FIG. 4 is a partial schematic cross-sectional view of a semiconductor wafer for explaining a bump formation process in the manufacturing method of a semiconductor integrated circuit device according to the embodiment of the present application (at completion of formation of an opening of an inorganic final passivation film). FIG. 5 is a partial schematic cross-sectional view of a semiconductor wafer for explaining a bump formation process in the manufacturing method of a semiconductor integrated circuit device according to the embodiment of the present application (at completion of formation of an opening of an organic final passivation film). FIG. 6 is a partial schematic cross-sectional view of a semiconductor wafer for explaining a bump formation process in the manufacturing method of a semiconductor integrated circuit device according to the embodiment of the present application (at completion of formation of a UBM film). FIG. 7 is a partial schematic cross-sectional view of a semiconductor wafer for explaining a bump formation process in the manufacturing method of a semiconductor integrated circuit device according to the embodiment of the present application (at completion of solder plating). FIG. 8 is a partial schematic cross-sectional view of a semiconductor wafer for explaining a bump formation process in the manufacturing method of a semiconductor integrated circuit device according to the embodiment of the present application (at completion of fabrication of the bottom layer film of the UBM film). FIG. 9 is a partial schematic cross-sectional view of a semiconductor wafer for explaining a bump formation process in the manufacturing method of a semiconductor integrated circuit device according to the embodiment of the present application (at completion of reflow). Based on the foregoing, a bump formation process or the like in the manufacturing method of a semiconductor integrated circuit device according to the embodiment of the present application will be described.

A 300Φ P-type single crystal silicon wafer 1 (see FIG. 1) is provided (the diameter of the wafer may be 450Φ, 220Φ, or others as necessary). For the wafer 1, a FEOL process 201 of forming a large number of MISFETs (8) is performed, as shown in FIG. 2. Subsequently, a BEOL process 202 of forming an 8-layer copper embedded wiring (wiring layer WS over the semiconductor substrate 1s) is performed.

FIG. 3 illustrates a cross-sectional structure when formation as far as the embedded eighth wiring layer M8 has been completed in the manner described above. As shown in FIG. 3, the embedded eighth wiring layer M8 is formed over the embedded seventh wiring layer M7, and the eighth layer copper embedded wiring 83 is embedded in the global overlying wiring interlayer insulating film 18 including the SiC-based insulating barrier film 84, the plasma TEOS-based inter-main-layer insulating film 85, or the like. The eighth layer copper embedded wiring 83 is covered by a barrier metal film 10 (TiN film) over the embedded eighth wiring layer on the side of the device surface 1a (first major surface) of the wafer.

Next, as shown in FIG. 4, the inorganic final passivation film 11 (SiON film) is formed almost all over the device surface 1a of the wafer by plasma CVD (Chemical Vapor Deposition). A lower final passivation opening 30 is formed by patterning the inorganic final passivation film 11 using normal lithography.

Next, as shown in FIG. 5, the organic final passivation film 9 (polyimide-based film) and an upper final passivation opening 31 are formed by coating and patterning a photosensitive polyimide film almost all over the device surface 1a of the wafer. The final passivation film 17 is formed by the inorganic final passivation film 11 and the upper final passivation opening 31. Although a variety of other configurations of the final passivation film 17 are possible, organic final passivation films are effective for absorbing the stress that may arise in the reflow process or the like.

Next, the solder bump formation process 203 (FIG. 2) will be described. As shown in FIG. 6, the lower UBM film 16a (TiW film) is formed almost all over the surface on the device surface 1a side of the wafer as an Adhesion Layer by sputtering film formation. Next, the lower copper film 16b is formed almost all over the surface of the lower UBM film 16a as a seed layer by sputtering film formation. Next, a UBM plating resist film 36 is formed on the side of the device surface 1a of the wafer by normal lithography. Next, the nickel film 16c is selectively formed as a barrier film over the lower copper film 16b by electroplating or the like. Next, the upper copper film 16d is formed as a Wetting Layer over the nickel film 16c by electroplating, for example. Subsequently, the resist film 36 which has become unnecessary is entirely removed by ashing or the like. Next, the lower copper film 16b is patterned in a self-alignment manner (see FIG. 7) by wet etching (with mixed solution of sulfuric acid and oxygenated water) or the like.

Next, as shown in FIG. 7, a solder plating resist film 32 is formed on the side of the device surface 1a of the wafer by normal lithography. Next, the solder bump 7 (before reflow) is formed by electroplating. Subsequently, the resist film 32 which has become unnecessary is entirely removed by ashing or the like. A variety of printing methods other than plating is available for forming a solder bump. However, plating is advantageous in terms of miniaturization of bump pitches.

Next, as shown in FIG. 8, the lower UBM film 16a is patterned in a self-alignment manner by wet etching (using oxygenated water-based etchant such as mixed solution of ammonia and oxygenated water).

Next, as shown in FIG. 9, the solder bump 7 (lead-free solder) is shaped into a generally spherical form by performing a reflow process (at about 240 to 260° C.) Since the TiW film 16a does not get wet by the solder, whereas the copper films 16b and 16d and the nickel film 16c get wet by the solder, shaping is autonomously performed.

3. Explanation of a probe device and a probe card used in a wafer probe test in the manufacturing method of a semiconductor integrated circuit device according to the embodiment of the present application (see mainly FIGS. 10 to 16)

Although specific description is provided in this section taking an exemplary probe needle having a flat tip, the present invention can be applied to a case where the tip of the needle is uneven or the tip of the needle is sharp.

In addition, although a specific description is provided in the following explanation taking as an example a case where the room temperature test, the high temperature test and the low temperature test are performed in the same device, the present invention can also be applied to a case where at least one of the room temperature test, the high temperature test and the low temperature test is performed in another prober.

Figure 10:
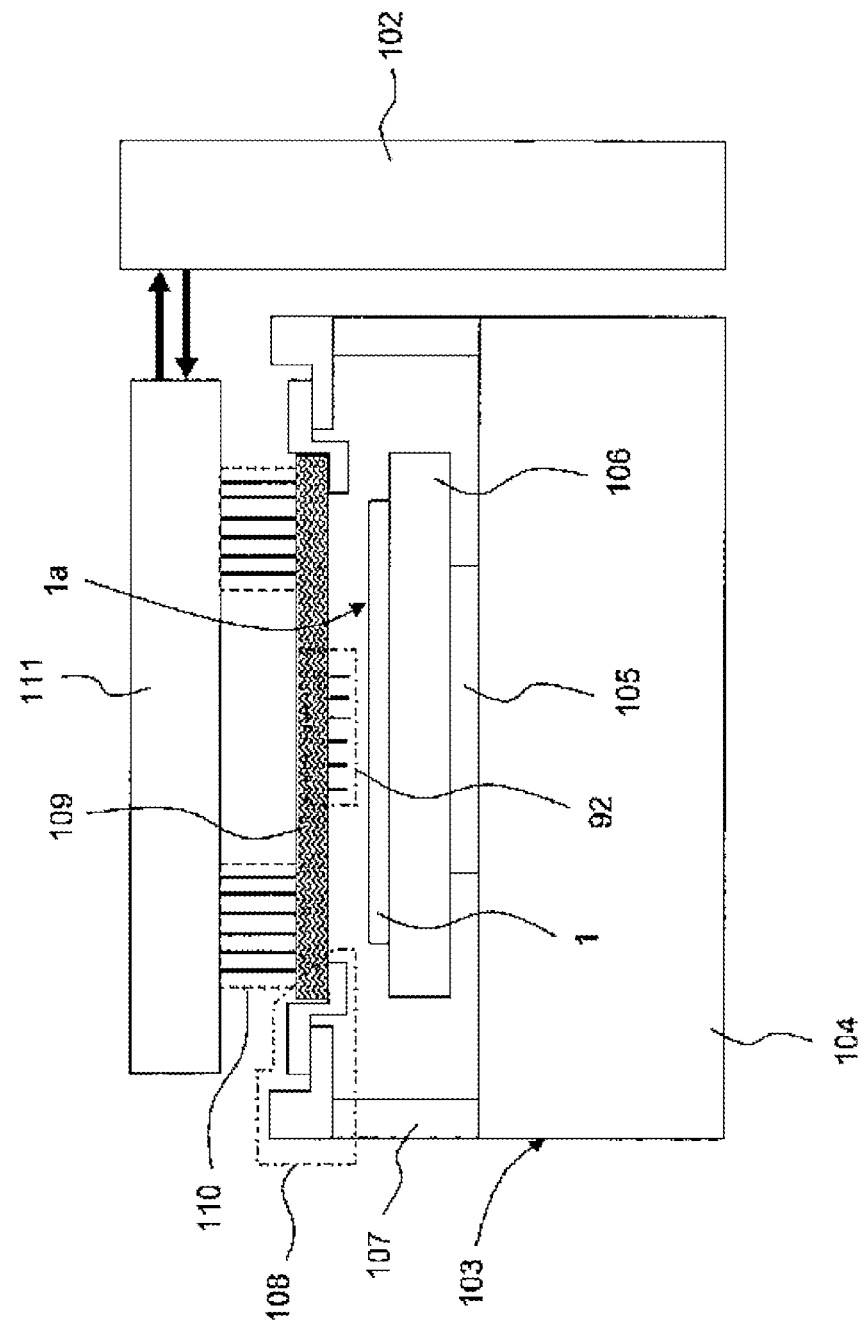
FIG. 10 is an overall schematic cross-sectional view of a tester, a probe device, and a probe card for explaining a probe device and a probe card used in a wafer probe test in the manufacturing method of a semiconductor integrated circuit device according to the embodiment of the present application.
Figure 11:
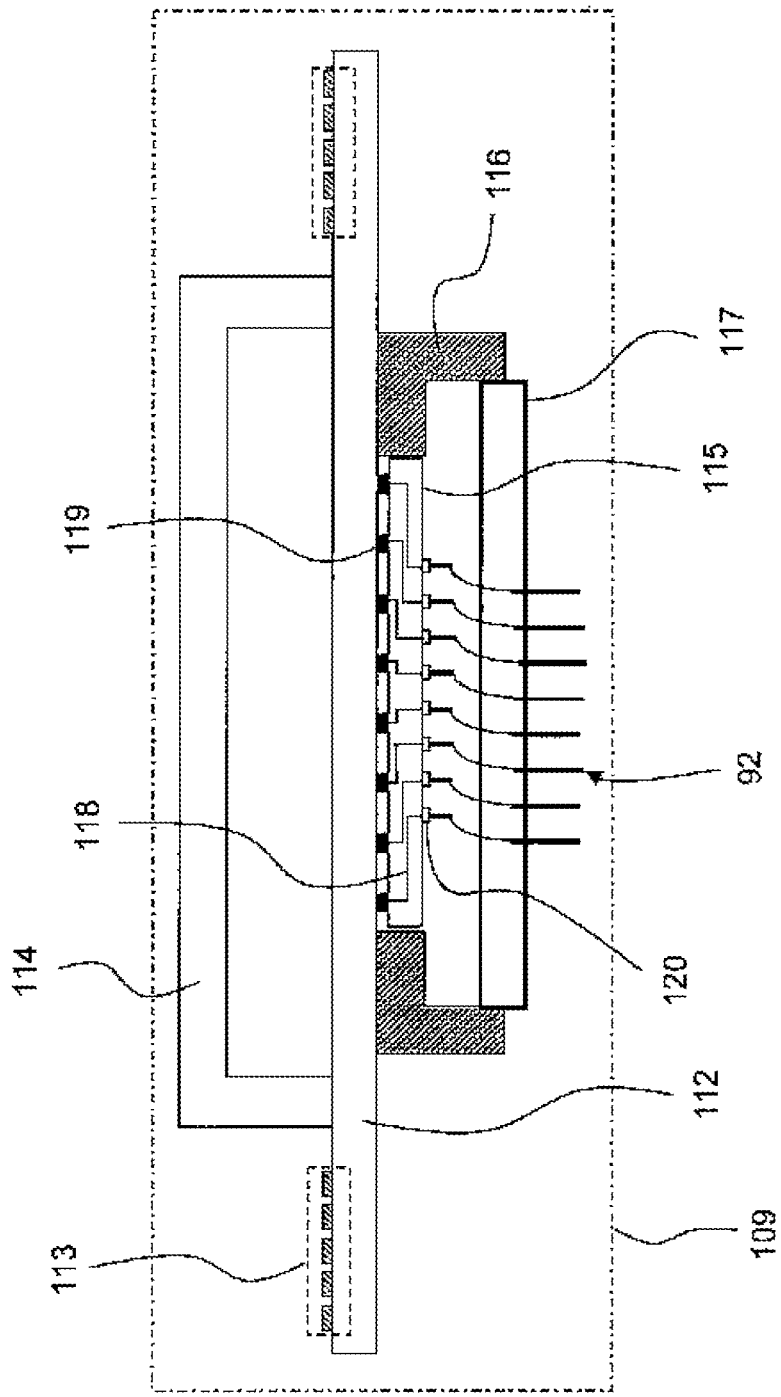
FIG. 11 is an enlarged schematic cross-sectional view of the probe card part of FIG. 10.
Figure 12:
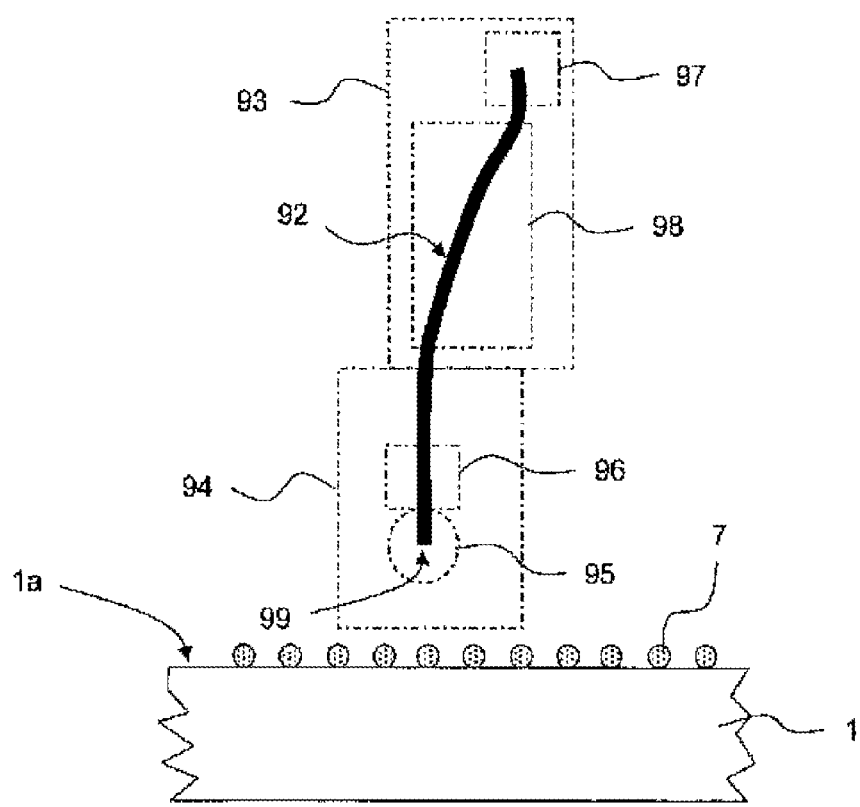
FIG. 12 is an enlarged cross-sectional view of a probe needle and a wafer to be inspected of FIG. 11.
Figure 13:
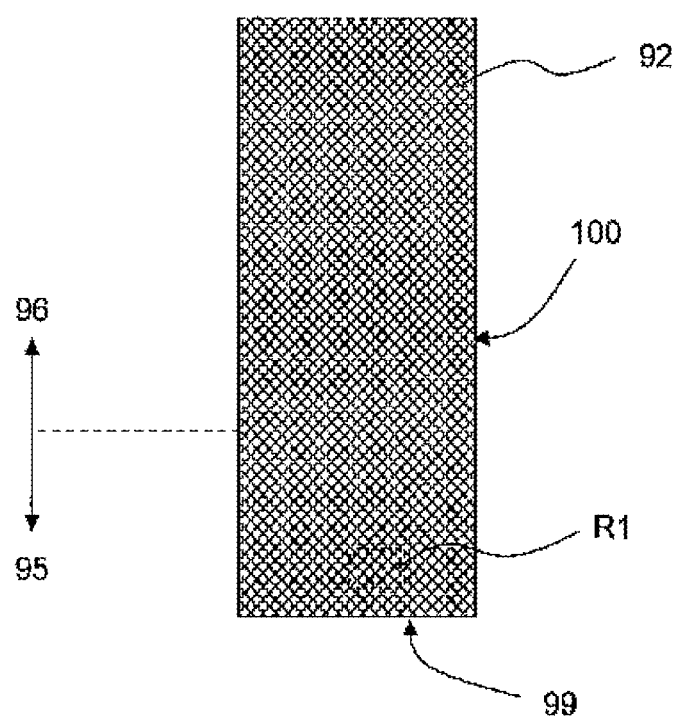
FIG. 13 is an enlarged cross-sectional view of the tip and the vicinity of the tip of the probe needle of FIG. 12.
Figure 14:
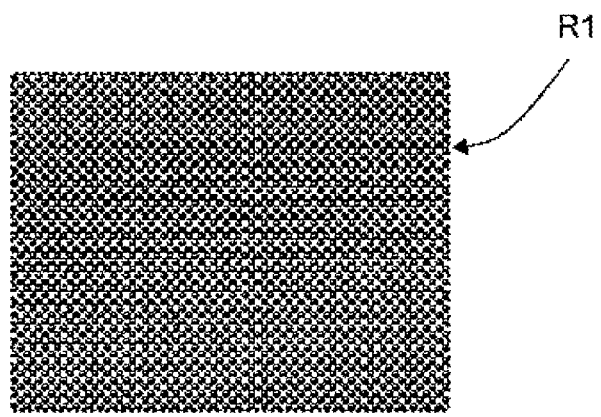
FIG. 14 is a schematic grain structure diagram for explaining a grain structure of a region R1 partially cut out from the cross section of FIG. 13.
Figure 15:
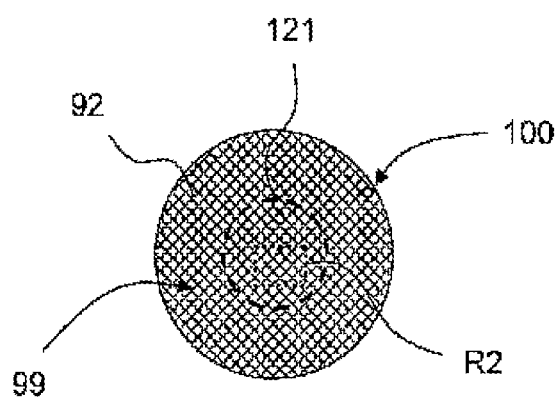
FIG. 15 is an enlarged plan view of the tip surface of the probe needle of FIG. 13.
Figure 16:
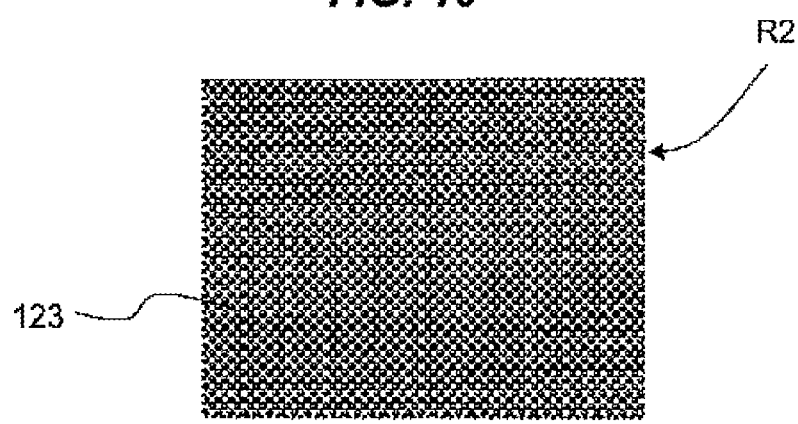
FIG. 16 is a schematic grain structure diagram for explaining a grain structure of a region R2 partially cut out from the tip surface of FIG. 15.

FIG. 10 is an overall schematic cross sectional view of a tester, a probe device, and a probe card for explaining a probe device and a probe card used in a wafer probe test in the manufacturing method of a semiconductor integrated circuit device according to the embodiment of the present application. FIG. 11 is an enlarged schematic cross-sectional view of the probe card part of FIG. 10. FIG. 12 is an enlarged cross-sectional view of the probe needle and the wafer to be inspected of FIG. 11. FIG. 13 is an enlarged cross-sectional view of the tip and the vicinity of the tip of the probe needle of FIG. 12. FIG. 14 is a schematic grain structure diagram for explaining the grain structure of the region R1 partially cut out from the cross section of FIG. 13. FIG. 15 is an enlarged plan view of the tip surface of the probe needle of FIG. 13. FIG. 16 is a schematic grain structure diagram for explaining the grain structure of the region R2 partially cut out from the tip surface of FIG. 15. Based on the foregoing, a probe device and a probe card used in the wafer probe test in the manufacturing method of a semiconductor integrated circuit device according to the embodiment of the present application will be described.

An exemplary wafer prober 103 which can be used for a wafer probe inspection 204 (FIG. 2) of a wafer with a bump is shown in FIG. 10. As shown in FIG. 10, a wafer absorption table 106 (heating or cooling table) is installed over an XYZ drive table 105 over a prober base 104 and, at the time of testing, a wafer to be tested 1 is vacuum adsorbed onto the wafer absorption table 106 with the device surface 1a facing upward. A probe card holder 108 is provided over a support pole 107 over the prober base 104, and a probe card 109 is held with a large number (about 15000) of probe needles 92 facing downward. A test head 111 is located above the probe card 109, a pogo pin 110 couples between the probe card 109 and the test head 111, and the test head 111 is made up to exchange signals with a tester 102.

Next, an exemplary cross-section of the probe card 109 is shown in FIG. 11. As shown in FIG. 11, the main body of the probe card 109 includes a main wiring substrate 112, with a reinforcing plate 114 being attached to the top surface of the main wiring substrate 112 to keep rigidity. In addition, a pogo seat 113 (pogo pin contact) is provided at the periphery of the top surface of the main wiring substrate 112 to contact the pogo pin 110. On the other hand, a needle set holder 116 is attached to the bottom surface of the main wiring substrate 112, and a relay wiring substrate 115 is installed at the bottom surface of the main wiring substrate 112 at the central part of the needle set holder 116. The relay wiring substrate 115, having a relay wiring 118 in it, is coupled to the main wiring substrate 112 via an upper coupling electrode 119. On the other hand, a needle coupling electrode 120 is provided at the bottom surface of the relay wiring substrate 115, where probe needles 92 are provided. The central part of the probe needles 92 is held by a needle support plate 117 provided at the lower end of the needle set holder 116.

Next, an enlarged view of the probe needle 92 and the lower part of the probe needle 92 are shown in FIG. 12. As shown in FIG. 12, an upper half 93 of the probe needle 92 includes an attachment part 97 at the root of the upper end and a curved part 98 below it (at least a part of the upper half 93 is curved), and substantially the entire lower half 94 of the probe needle 92 extends substantially vertically toward the top surface 1a (the surface having the solder bumps 7 provided on) of the wafer 1. The lower end of the probe needle 92 includes a tip surface 99, a tip 95, a vicinity of the tip 96 located nearby, or the like, with the tip surface 99 being relatively flat and substantially parallel with the top surface 1a of the wafer 1. A palladium-based probe needle (granular grain structure) "Paliney7" (Cobra needle) available from Wentworth Laboratories, U.S. can be given as an example of a preferable probe needle. The base material is a six-element alloy having palladium as the major component, the composition being palladium: 35% by mass, silver: 30% by mass, platinum: 10% by mass, gold: 10% by mass, copper: 14% by mass, and zinc: 1% by mass (silver, or silver and copper are contained as one of the major components; the same goes for the following base materials). Besides the foregoing, a three-element alloy (with a composition of palladium: 40% by mass, silver: 40% by mass, and copper: 20% by mass), a four-element alloy (with a composition of palladium: 42 to 44% by mass, silver: 38 to 41% by mass, platinum: 0 to 1% by mass, and copper: 16 to 17% by mass), or the like can be given as a preferred example of the base material. The palladium-based probe needle may be any composition provided that it has a granular grain structure.

At least the tip 99 of the palladium-based probe needle must have mainly a granular grain structure. In addition, it is desirable that the tip 99 and the vicinity of the tip 96 have mainly a granular grain structure considering the needle cleaning or needle reuse process described below. Additionally, considering ease of manufacturing, it is further desirable that substantially the entire needle has mainly a granular grain structure. However, it is not essential that the vicinity of the tip 96 and the entire needle have a granular grain structure, because providing the corresponding part with a columnar grain structure is effective for keeping rigidity of the curved part 92, and it is also conceivable to exchange only the tip 99 or to provide only the tip 99 with a granular grain structure as a reuse process.

Next, an enlarged cross-sectional view of the lower end of the probe needle 92 of FIG. 12 (the tip surface 99, the tip 95, and the vicinity of the tip 96) are shown in FIG. 13. As shown in FIG. 13, the external shape of the lower end of the probe needle 92 is substantially columnar, with the side surface 100 corresponding to the surface of the curved cylindrical column. The tip surface 99 is a plane which is substantially perpendicular to the main axis of the cylindrical column. The diameter of the probe needle in this example is about 80 μm, and the entire length is about 5.5 mm.

Next, a microscopic crystal grain structure of the region R1 cut out from the cross-sectional part of FIG. 13 is schematically shown in FIG. 14. As shown in FIG. 14 (the same goes for FIG. 16), the grain structure is the Granular Structure, which is a structure compared with the Columnar Structure extending longways along the main axis of the probe needle 92. Although the columnar structure is uniaxial, the granular structure is equiaxial and thus referred to as an Equiaxed Structure. In addition, unlike a Grain having the columnar structure extending relatively longways along the axis, the grain diameter is generally sufficiently smaller than the diameter of the probe needle 92 (about 80 μm in the above example) and thus it may be referred to as Fine-Grained Structure. The average value of the grain diameter of the probe needle 92 falls within a range of about 0.1 μm to 0.3 μm.

Next, a bottom view of FIG. 13 (plan view of the tip surface 99) is shown in FIG. 15. As shown in FIG. 15, the tip surface 99 of the probe needle 92 is substantially circular (diameter: about 80 μm), and the part that actually contacts the bump electrode 7, which is a contact portion 121 at the time of the measurement is substantially circular, the diameter of which being about 30 μmm (for a probe needle having a diameter of about 80 μm).

Next, a microscopic crystal grain structure of the region R2 cut out from the cross-sectional part of FIG. 15 is schematically shown in FIG. 16, which is substantially identical to the one previously described.

4. Explanation of a wafer probe test process in the manufacturing method of a semiconductor integrated circuit device according to the embodiment of the present application (see mainly FIGS. 17 to 21, and FIG. 2)

Although specific description is provided in this section for an exemplary 300Φ wafer having about several thousands of solder bumps in a single chip region, the target wafer may have a diameter of 200Φ, 450Φ, or any other diameters. In addition, the number of bumps in a single chip region may be larger or smaller.

In addition, the number of probe needles (number of needles) included in a single probe card is about 15000 when simultaneously measuring four chips as well. Therefore, the wafer must be transferred relatively in the horizontal direction in order to cover the entire wafer, and the region that can be covered at a time, i.e., a "unit measurement region" may be generally a rectangular region which is relatively close to a square, or may be a strip-shaped region crossing the wafer. Although description is provided in the following example for a case where the unit measurement region is generally a rectangular region for the purpose of convenience, also in case of a strip-shaped region, an entire wafer collective measurement covering the entire wafer by a one-time contact will do.

Figure 17:
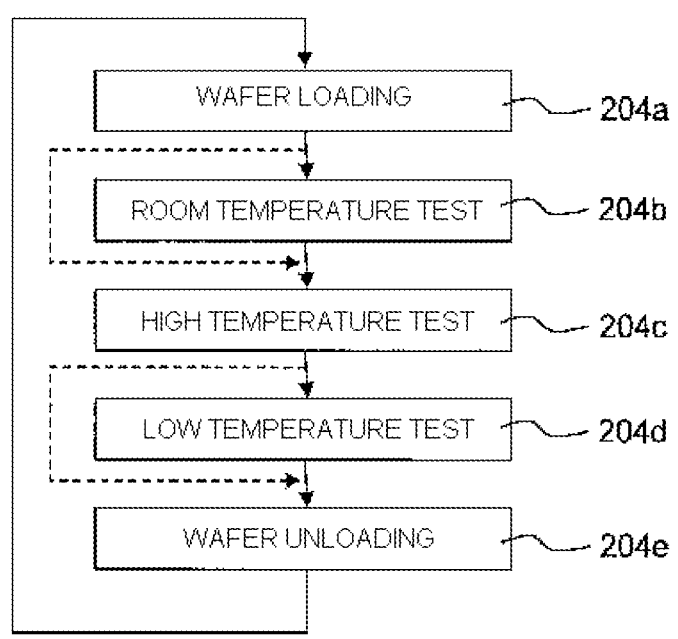
FIG. 17 is an overall block flow diagram of the wafer probe test for explaining a wafer probe test process in the manufacturing method of a semiconductor integrated circuit device according to the embodiment of the present application.
Figure 18:
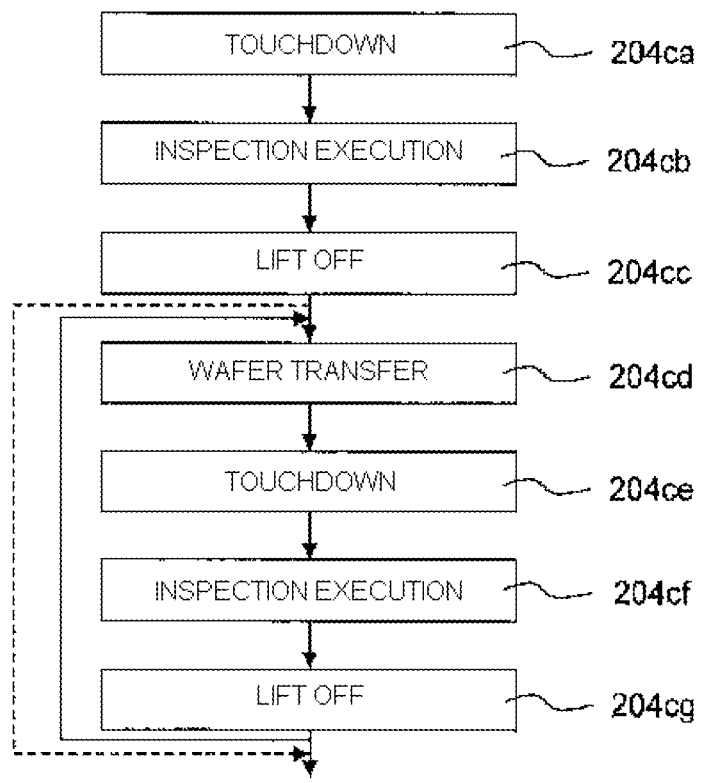
FIG. 18 is a block flow diagram of the high temperature test of FIG. 17.
Figure 19:
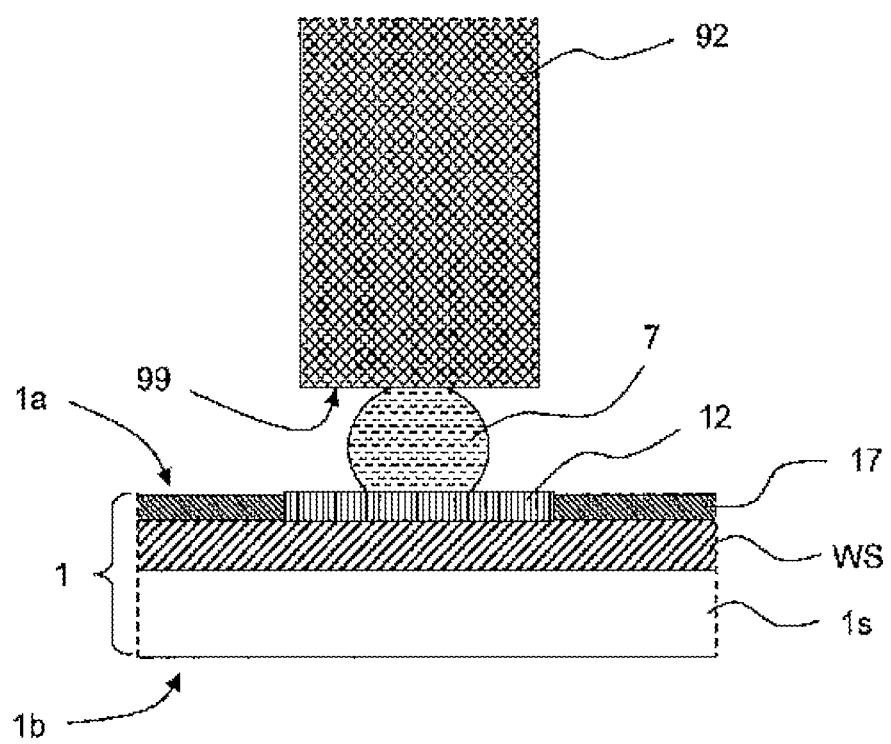
FIG. 19 is a schematic cross-sectional view of the probe needle and the wafer illustrating the relation between the probe needle point and the bump over the wafer when performing inspection of FIG. 18.
Figure 20:
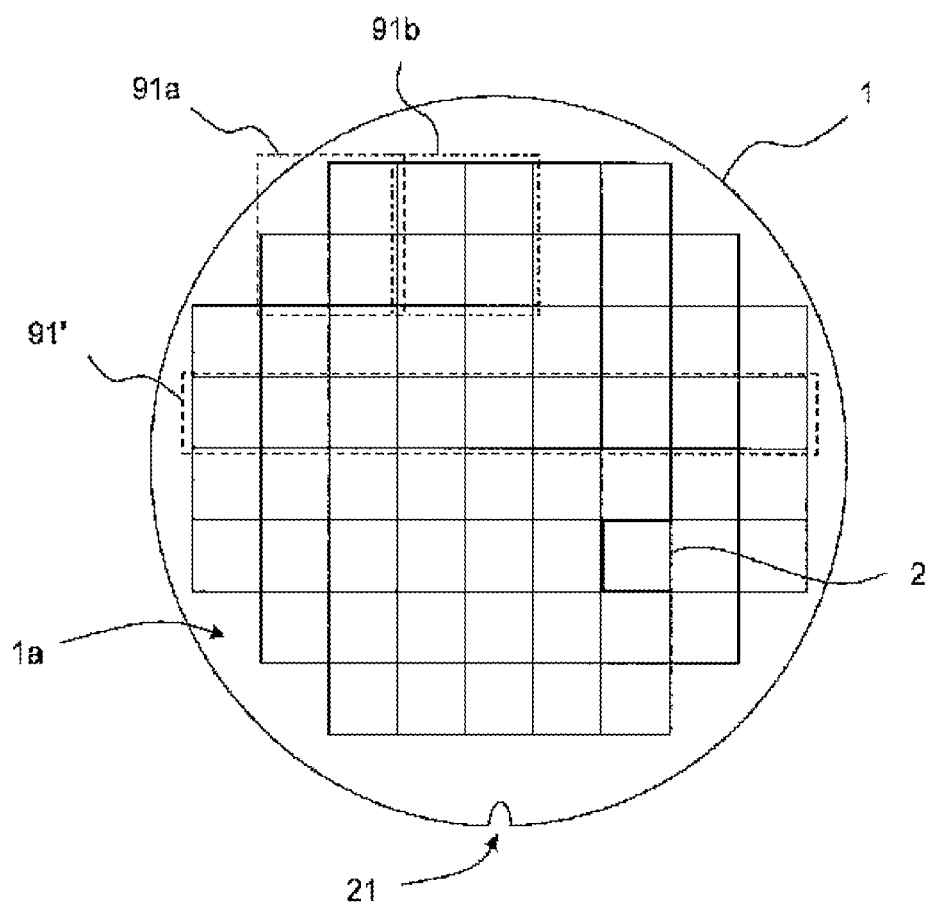
FIG. 20 is an overall wafer plan view illustrating an exemplary arrangement of the chip region in the device surface of the wafer of FIG. 19.
Figure 21:
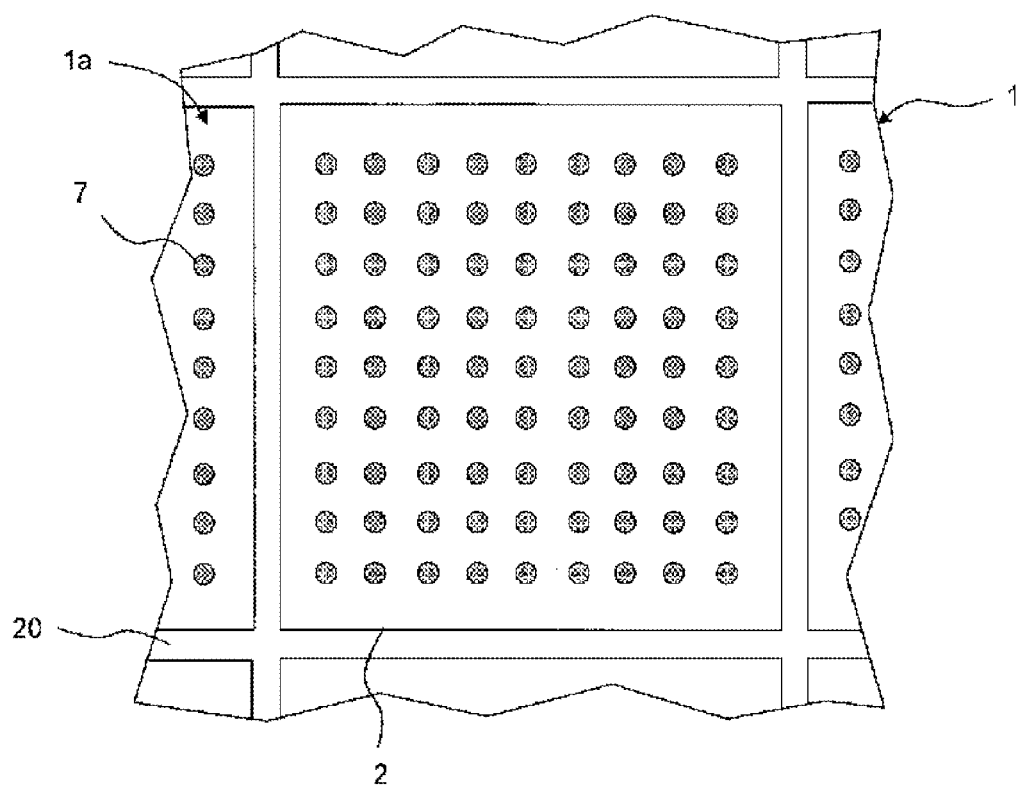
FIG. 21 is a partial enlarged view of FIG. 20.

FIG. 17 is an overall block flow diagram of the wafer probe test for explaining the wafer probe test process in the manufacturing method of a semiconductor integrated circuit device according to the embodiment of the present application. FIG. 18 is a block flow diagram of the high temperature test of FIG. 17. FIG. 19 is a schematic cross-sectional view of the probe needle and the wafer illustrating the relation between the probe needle point and the bump over the wafer when performing inspection of FIG. 18. FIG. 20 is an overall wafer plan view illustrating an exemplary arrangement of the chip region in the device surface of the wafer of FIG. 19. FIG. 21 is a partial enlarged view of FIG. 20. Based on the foregoing, a wafer probe test process in the manufacturing method of a semiconductor integrated circuit device according to the embodiment of the present application will be described.

First, the state of a wafer 1 to be inspected at wafer probe inspection 204 (FIG. 2) will be described, referring to FIGS. 20 and 21. As shown in FIG. 20, usually a large number of semiconductor chip regions 2 over the device surface 1a of the wafer 1 are paved in a matrix along mutually perpendicular axes with a notch 21 being a directional standard (although the actual number of semiconductor chip regions 2 is much larger, a very small number of the regions is shown for illustrative purpose). Shown by the dashed line in the drawing is an example of ranges 91a and 91b (unit measurement range) that can be measured by a one-time contact. Although the configuration of the unit measurement range includes the configuration formed by only the chip region 2 within a distance as close as possible (compact type) such as the unit measurement ranges 91a and 91b, or the configuration crossing the wafer (crossing type) such as the unit measurement range 91', description is provided taking the compact type as an example. The entire chip region 2 over the wafer 1 can be defined as a unit measurement range.

Figure 26:
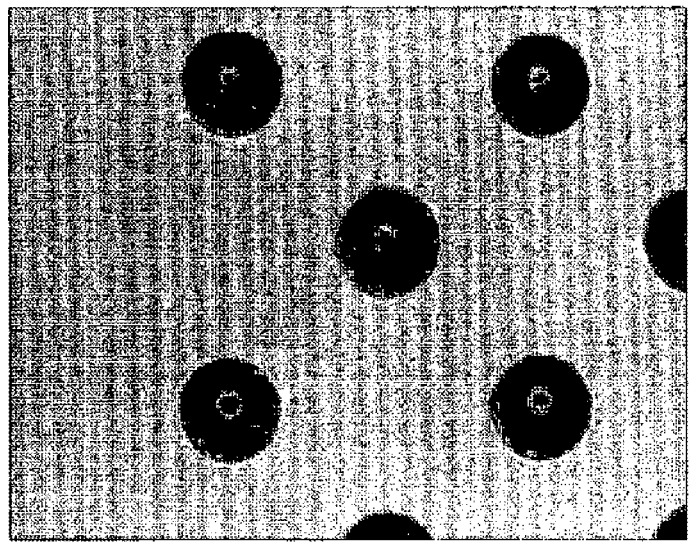
FIG. 26 is a SEM image of a tip surface of a probe needle having a columnar grain structure used for the comparison in FIG. 24.

Next, an enlarged plan view of individual chip regions 2 and their periphery of FIG. 20 is shown in FIG. 21. As shown in FIG. 21, the respective chip regions 2 paved in a matrix over the device region 1a of the wafer 1 are arranged in close proximity to each other, with lattice-shaped dicing regions 20 (scribe region) located in between. The solder bumps 7 are arranged over each chip region 2 in a square lattice manner (length of one side of the lattice being about 240 µm). Since the solder bumps 7 are arranged as necessary, the lattice-shaped arrangement may lack some lattice points or may lack a column of lattice points. In addition, although the number of bumps per unit chip region is usually in the order of several thousands for actual SOC device chips or microcomputer-related chips, an extremely small number of the bumps is shown for illustrative purpose. Besides the 2-dimensional simple tetragonal lattice described above, the arrangement of the bumps may be a body-centered tetragonal lattice as shown in FIG. 26, or other orthogonal or orthorhombic lattices.

Next, an exemplary total flow of the wafer probe inspection 204 (FIG. 2) for the wafers 1 is shown in FIG. 17 (see FIGS. 10 to 12). As shown in FIG. 17, the wafer 1 to be inspected is adsorbed to a wafer stage 106 of FIG. 10 (wafer loading process 204a), and a room temperature test 204b is performed. Next, a high temperature test 204c is performed by raising the temperature of the wafer stage 106. Next, a low temperature test 204d is performed by cooling the wafer stage 106. When all the tests that must be performed are completed, vacuum absorption of the wafer stage 106 becomes off, and the wafer 1 to be inspected which has been inspected is carried out of the wafer stage 106, and a new wafer 1 to be inspected is adsorbed to the wafer stage 106 of FIG. 10. Subsequently, the cycle is repeated until there remains no target wafer 1. If one or both of the room temperature test 204b and the low temperature test 204d will not be performed, or will be performed in another prober, it is only required to skip the test which will not be performed as shown by the dashed line in the drawing.

Next, specific test procedures for respective tests, namely the room temperature test 204b, the high temperature test 204c, and the low temperature test 204d will be described, referring to FIGS. 18 and 19. Although there is difference in test items, the procedures of each test, regardless of it being the room temperature test 204b, the high temperature test 204c, or the low temperature test 204d are much the same, and therefore description will be provided for the high temperature test 204c.

As shown in FIGS. 18 and 19, when the temperature of the wafer 1 stabilizes to a predetermined high temperature test temperature (90° C. or higher and 130° C. or lower), the test is started (the high temperature probe test is performed in a state where the semiconductor wafer is heated to a predetermined temperature of 90° C. or higher and 130° C. or lower). When positioning in the horizontal direction (XY direction) is completed by transfer of the XYZ drive table 105 in the horizontal direction (FIG. 10), with the wafer 1 to be inspected adsorbed to the wafer stage 106 (FIG. 10), the XYZ drive table 105 rises and reaches the contact state (touchdown process 204ca of FIG. 18). On this occasion, the inspection region is assumed to be the unit measurement range 91a.

In this example, as previously described, the wafer 1 to be inspected includes the semiconductor substrate 1s, the wiring layer WS and the final passivation film 17 over the semiconductor substrate as shown in FIG. 19, and the solder bump 7 (a tin-based lead-free solder bump) is formed over the metal pad 12 (a non-aluminum-based metal pad) over the wafer.

In this contact state, inspection of respective chip regions 2 to which the unit measurement range 91a belongs is performed (inspection execution process 204cb of FIG. 18). Upon completion of inspection of respective chip regions 2 to which the unit measurement range 91a belongs, the XYZ drive table 105 (FIG. 10) descends (lift off process 204cc of FIG. 18). If the unit measurement range 91a is the entire chip region, the test is completed in a detouring manner as shown by the dashed line. If, on the other hand, the chip regions 2 to which the unit measurement range 91a belongs is a part of the entire chip region as shown in the drawing of the unit measurement range 91a, the wafer transfers to the unit measurement range 91b of FIG. 20 (wafer transfer process 204cd of FIG. 18). Upon completion of the transfer of the wafer, the touchdown process 204ce, the inspection execution process 204cf, and the lift off process 204cg are repeated again, similarly to the foregoing. Subsequently, the cycle from the wafer transfer 204cd to the lift off process 204cg is repeated as long as there remains any chip region to be inspected.

5. Explanation about reuse of the probe needle of the probe card used in the wafer probe test in the manufacturing method of a semiconductor integrated circuit device according to the embodiment of the present application (see mainly FIG. 22)

Although an example of sharpening the probe needle with a file-like surface is described as a reuse method of the probe needle in this section, a variety of other methods such as cutting the tip or exchanging the tip and the vicinity of the tip are applicable as reuse methods of the probe needle.

Although reuse of the needle can be performed in an arbitrary manner, exchanging the probe card, which is very expensive, with a new item after using it for only several or slightly above a dozen wafers is not realistic.

Figure 22:
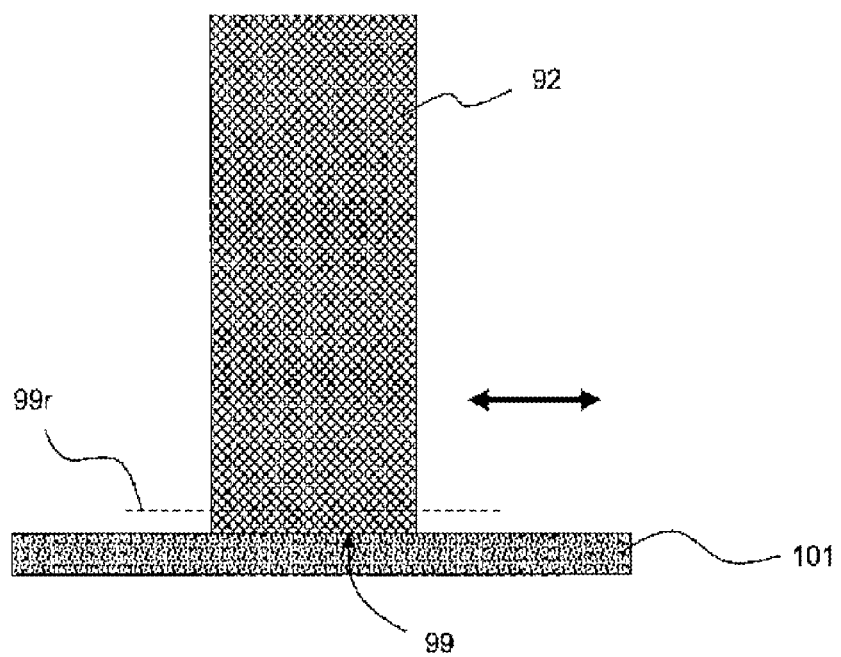
FIG. 22 is a schematic cross-sectional view of a probe needle and a cleaning seat explaining an exemplary reuse method of a probe needle of a probe card used in a wafer probe test in the manufacturing method of a semiconductor integrated circuit device according to the embodiment of the present application.

FIG. 22 is a schematic cross-sectional view of a probe needle and a cleaning seat explaining an exemplary reuse method of a probe needle of a probe card used in a wafer probe test in the manufacturing method of a semiconductor integrated circuit device according to the embodiment of the present application. Based on the foregoing, the reuse process of the probe needle of the probe card used in the wafer probe test in the manufacturing method of a semiconductor integrated circuit device according to the embodiment of the present application will be described.

As shown in FIG. 22, the probe needle 92 is usually pushed against a cleaning sheet 101 and transferred in the horizontal direction in a state combined with the probe card 109 (usually repeats moving forward and backward for a very short distance). Accordingly, sharpening the needle point by about several micro meters results in appearance of a cleaned tip surface 99r, which becomes a new tip surface 99.

6. Explanation of processes subsequent to the wafer probe test process in the manufacturing method of a semiconductor integrated circuit device according to the embodiment of the present application (see mainly FIGS. 23 and 2)

Although a specific description is provided in this section for an exemplary standard individual resin sealing as a packaging process, the present invention is not limited to this sealing and can be applied to ceramic sealing, can sealing, or MAP (Mold Array Package) in which individual devices are separated by package dicing after resin sealing the entire wafer in a lump.

In addition, although a specific description is provided for an example of directly die bonding (flip-chip bonding) over the top surface of the package wiring substrate in a flip-chip method, die bonding (flip-chip bonding) may be performed over the bottom surface of the package wiring substrate. Furthermore, die bonding (flip-chip bonding) may be performed over a device surface or the like of another chip which has been die bonded over the top surface of the package wiring substrate.

Figure 23:
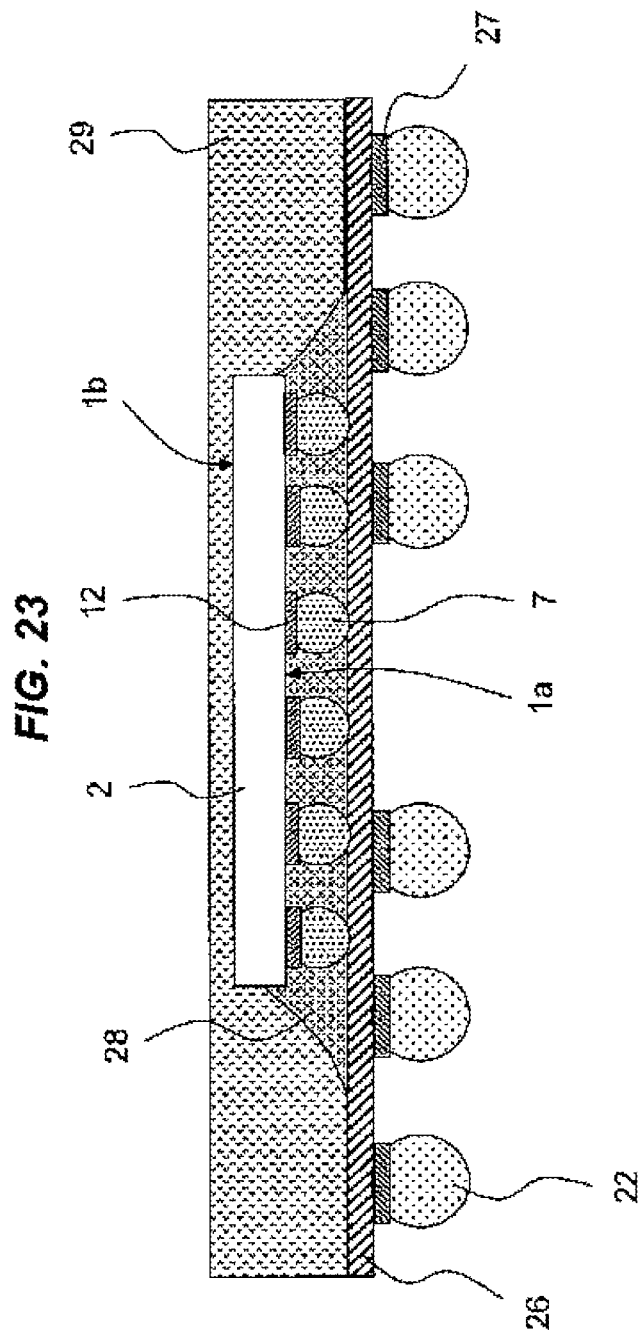
FIG. 23 is an overall package cross-sectional view illustrating an exemplary completed package for explaining processes subsequent to the wafer probe test process in the manufacturing method of a semiconductor integrated circuit device according to the embodiment of the present application.

FIG. 23 is an overall package cross-sectional view illustrating an exemplary completed package for explaining processes subsequent to the wafer probe test process in the manufacturing method of a semiconductor integrated circuit device according to the embodiment of the present application. Based on the foregoing, processes subsequent to the wafer probe test process in the manufacturing method of a semiconductor integrated circuit device according to the embodiment of the present application will be explained.

As shown in FIG. 2, appearance inspection such as a bump height inspection 205 (optical inspection by reflection) is performed as necessary for the wafer 1 for which the wafer probe inspection 204 has been completed. However, such an inspection can be skipped as shown by the dashed line if not required. Next, if necessary, back grinding or the like is performed for the back side 1b of the wafer 1.

Next, as shown in FIG. 2, the wafer 1 is divided into individual chips 2 (wafer dicing process 206) by dicing with the solder bump 7 existing and the device surface 1a (first major surface) of the wafer 1 being adhered to a dicing tape.

Next, as shown in FIGS. 2 and 23, individual chips 2 are picked up from the dicing tape and mounted over a metal land (copper film) over the top surface of the package wiring substrate 26. Subsequently, coupling with the metal land over the package wiring substrate 26 is formed by performing reflow (flip-chip bonding process 211).

Next, as shown in FIGS. 2 and 23, after having filled between the package wiring substrate 26 and the device surface 1a of the chip 2 with under-fill liquid resin 28, a heating process (cure process) is performed for hardening between the substrate and the device surface (under fill process 212).

Next, as shown in FIGS. 2 and 23, a sealing resin body 29 is formed over the top surface of package wiring substrate 26 so as to seal the chip 2 by sealing with epoxy-based sealing resin by transfer molding or compression molding (resin sealing process 213).

Next, as shown in FIGS. 2 and 23, an external solder bump (lead-free solder bump) is formed by mounting and reflowing a solder ball over a metal land part 27 (copper film) of the bottom surface of the package wiring substrate 26 (external solder bump formation process 214).

7. Preliminary explanation and consideration of the embodiment and the invention as whole (see mainly FIGS. 24 to 27)

Figure 25:
FIG. 25 is a TEM image of a probe needle having a granular grain structure used for the comparison in FIG. 24.
Figure 27:
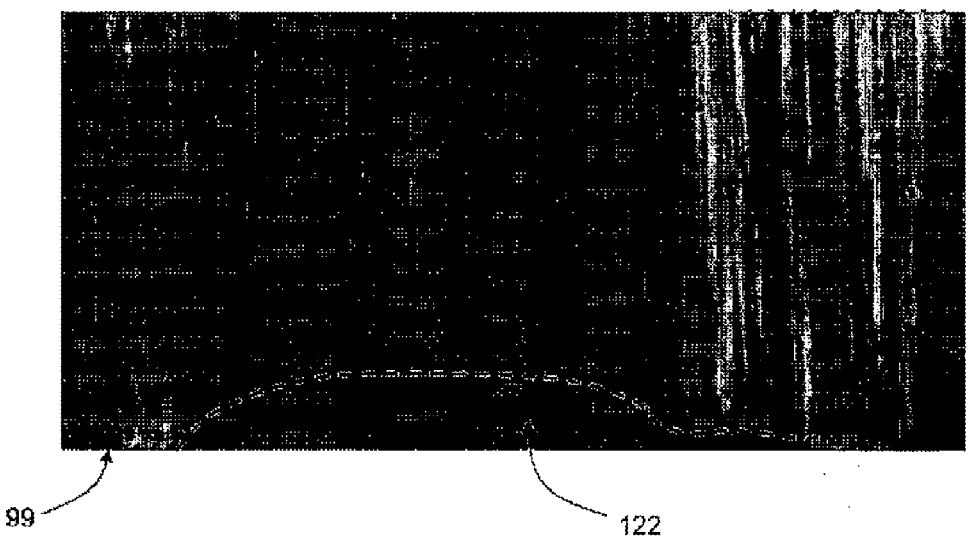
FIG. 27 is a TEM image of the probe needle having a columnar grain structure used for the comparison in FIG. 24.

FIG. 24 is a table comparing the result of a high temperature wafer probe test using probe needles having columnar and granular structures. FIG. 25 is a TEM image of a probe needle having a granular grain structure used for the comparison in FIG. 24. FIG. 26 is an SEM image of a tip surface of a probe needle having a columnar grain structure used for the comparison in FIG. 24. FIG. 27 is a TEM image of a probe needle having a columnar grain structure used for the comparison in FIG. 24. Based on the foregoing, preliminary explanation and consideration of the embodiment and the invention as whole will be provided.

FIG. 24 compares occurrence or no occurrence of open failure (circles indicating no occurrence, cross marks indicating occurrence) when the high temperature probe inspection is performed using palladium-based probe needles of columnar crystal (comparative example) and granular crystal (example corresponding to the embodiment described). The 10-second test time is the normal average test time per unit measurement ranges 91a, 91b and 91', and the 60-second test time is an effect acceleration test time which has been set longer in order to make the difference clear. Measurements have been performed with the test temperature incremented from 90° C. to 130° C. at an interval of 10° C. In addition, the case of 25° C. is shown as a standard. Two 300Φ wafers are target wafers, with the number of cycles including wafer transfer, touchdown, inspection execution, and lift off being about 276 for each wafer.

As can be seen from the above result, the high temperature test of 110° C. or higher using a probe needle having a crystal grain structure of columnar crystals suggests that occurrence of open failure is already inevitable according to measurements for two wafers with the normal inspection time. In addition, from the high temperature test in a range of 90° C. to lower than 110° C., according to the probe needle having the crystal grain structure of columnar crystals, occurrence of open failure is inevitable by measurements corresponding to 12 wafers.

On the other hand, no open failure occurs in measurements corresponding to 12 wafers at 130° C. with a probe needle having a crystal grain structure of granular crystals. The reuse process is required at a regular interval as with other probe needles due to stain or inevitable oxidation of the base material during repeated tests.

Next, a TEM (Transmission Electron Microscope) image of a probe needle having a crystal grain structure of granular crystals is shown in FIG. 25. As shown in FIG. 25, each grain exhibits a relatively minute granular shape.

FIG. 26 is an SEM image of a tip surface of the probe needle (bottom surface of the needle) having a grain structure of columnar crystals in which open failure has occurred. Solder components adhere to the central part of the probe needle and solder components diffuse over the circumference of the central part in a circular manner. The circular stain has been identified to be tin components originating from the solder as a result of an element analysis.

In order to further clarify the foregoing, a TEM image of the cross section of the probe needle of FIG. 26 taken along the main axis is shown in FIG. 27. As shown in FIG. 27, there is a part 122 having tin diffused inside from the tip surface 99 of the probe needle. The part has also been identified to be tin components originating from the solder as a result of an element analysis.

In addition, a substantially elongated columnar crystal extends along the main axis (main axis of a cylindrical column) direction in the probe needle having a crystal grain structure of a columnar crystal.

From the above results, open failure occurs with a probe needle having a grain structure of columnar crystals because tin components adhering to the surface rapidly diffuse along a high speed diffusion path between columnar crystals along the main axis of the probe needle as far as a relatively deep position and rapidly oxidizes so that the conduction path between grains is rapidly blocked.

In contrast, there is no such problem with a probe needle having a crystal grain structure of granular crystals because the high speed diffusion path between granular crystals is relatively short and non-directional and thus the adhering tin components do not diffuse inside but remain in a very small portion of the surface region, so that they can be easily removed by periodical cleaning process.

Generally, in spite of their preferable characteristic of high rigidity, tungsten-based probe needles have a problem that solder components can easily adhere to the needles, whereas palladium-based probe needles, despite their slightly low rigidity, have a preferable characteristic that solder components can not easily adhere to the needles. Therefore, palladium-based probe needles are frequently used as probe needles for wafers with solder bumps. Similarly to probe needles of other categories, such a palladium-based probe needle generally forms a Billet from a palladium-based base material, which is then subjected to Extrusion, forming a wire rod. The wire rod is repeatedly subjected to Drawing by a Drawing Die and subsequent annealing (recrystallization or the like) for many times. After that, a probe needle with a desired thickness is obtained.

Taking into account such a manufacturing method and the fact that the palladium-based probe needles have a relatively low rigidity, recrystallization is set to be relatively weak for many palladium-based probe needles, with emphasis placed on columnar crystallization by Drawing in order to keep rigidity. On the other hand, probe needles having a crystal grain structure of granular crystals such as those illustrated above have been adjusted to have an equiaxial fine grain structure for applications with relatively relaxed demand for rigidity by sufficiently progressing recrystallization in each Drawing process.

8. Summary

Although the invention made by the inventors has been specifically described based on the embodiments, the invention is not limited to them and may be modified in various ways within a range that does not deviate from the spirit.

Although a specific description has been provided in the embodiments described above for devices having mainly copper-based embedded wiring, the present invention is not limited to the wiring and can also be applied to devices having aluminum-based non-embedded wiring, silver-based embedded wiring, and other metal-based embedded wiring.

In addition, although a specific description has been provided taking tantalum nitride-based barrier metal as exemplary barrier metal against copper, the present invention is not limited to the metal and other types of barrier metal will do such as titanium nitride-based barrier metal (including a multilayered barrier of Ti/TiN), ruthenium-based barrier metal, or the like. In addition, although a specific description has been provided for exemplary barrier metal of a TaN film single layer, the present invention is not limited to the barrier metal and a multi-layer barrier of Ta/TaN will do.

Furthermore, although a specific description has been provided for an example using mainly SiC as an insulative copper diffusion barrier film, the present invention is not limited to the film, and other types of film such as SiCN, SiN, or the like will do.

Although an example of forming a semiconductor integrated circuit device with mainly a P-type single crystal silicon wafer being the starting material in the above embodiments, the present invention is not limited to the wafer and can be applied to a case where a semiconductor integrated circuit device is formed with an N-type single crystal silicon wafer, an SOI wafer, an epitaxy wafer, or the like being the starting material. Additionally, the present invention can be applied to compound semiconductors, besides silicon-based semiconductors, such as SiGe, GaAs, SiC, GaN, InP, or the like as the base material of the wafer.

What is claimed is:

1. A manufacturing method of a semiconductor integrated circuit device comprising:
    forming a plurality of integrated circuit chip regions over a first major surface of a semiconductor wafer;
    forming a plurality of solder bumps for each of the integrated circuit chip regions by wafer processing; and
    performing a high temperature probe test with a palladium-based probe needle contacting each of the solder bumps over an integrated circuit chip region to be inspected, among the integrated circuit chip regions, at least a tip of the palladium-based probe needle having mainly a granular grain structure comprised of an equiaxed structure having a grain diameter thereof smaller than a diameter of the probe needle, the grain diameter being about 0.1 µm to 0.3 µm.

2. The manufacturing method of a semiconductor integrated circuit device according to claim 1,
    wherein the solder bumps are tin-based lead-free solder.

3. The manufacturing method of a semiconductor integrated circuit device according to claim 2,
    wherein at least the tip and a vicinity of the tip of the palladium-based probe needle have mainly a granular grain structure.

4. The manufacturing method of a semiconductor integrated circuit device according to claim 2,
    wherein substantially a whole of the palladium-based probe needle has mainly a granular grain structure.

5. The manufacturing method of a semiconductor integrated circuit device according to claim 4,
    wherein the tip and the vicinity of the tip of the palladium-based probe needle are substantially perpendicular to the first major surface of the semiconductor wafer.

6. The manufacturing method of a semiconductor integrated circuit device according to claim 5,
    wherein at least a part of an upper half of the palladium-based probe needle is curved.

7. The manufacturing method of a semiconductor integrated circuit device according to claim 5,
    wherein the tip surface of the palladium-based probe needle has a substantially flat shape.

8. The manufacturing method of a semiconductor integrated circuit device according to claim 6,
    wherein the palladium-based probe needle contains silver as one of major components besides palladium.

9. The manufacturing method of a semiconductor integrated circuit device according to claim 6,
    wherein the palladium-based probe needle contains silver and copper as one of major components besides palladium.

10. The manufacturing method of a semiconductor integrated circuit device according to claim 9,
    wherein the high temperature probe test is performed with the semiconductor wafer being heated to a predetermined temperature of 90° C. or higher and 130° C. or lower.

11. The manufacturing method of a semiconductor integrated circuit device according to claim 9,
    wherein each of the solder bumps is provided over a non-aluminum-based metal pad.

12. The manufacturing method of a semiconductor integrated circuit device according to claim 11,
    wherein the non-aluminum-based metal pad does not include a gold-based film.

* * * * *